(12) United States Patent
Ooba et al.

(10) Patent No.: US 7,151,431 B2
(45) Date of Patent: Dec. 19, 2006

(54) RESISTOR ELEMENT, STRESS SENSOR AND METHOD FOR MANUFACTURING THEM

(75) Inventors: Etsuo Ooba, Nagano (JP); Atsuomi Inukai, Nagano (JP); Fumiaki Karasawa, Nagano (JP); Hiroshi Yajima, Nagano (JP)

(73) Assignee: Elantech Devices Corporation (TW)

( * ) Notice: Subject to any disclaimer, the term of this patent is extended or adjusted under 35 U.S.C. 154(b) by 178 days.

(21) Appl. No.: 10/467,144

(22) PCT Filed: Feb. 14, 2002

(86) PCT No.: PCT/JP02/01250

§ 371 (c)(1),
(2), (4) Date: Aug. 5, 2003

(87) PCT Pub. No.: WO02/065487

PCT Pub. Date: Aug. 22, 2002

(65) Prior Publication Data
US 2005/0050959 A1    Mar. 10, 2005

(30) Foreign Application Priority Data

| Feb. 16, 2001 | (JP) | 2001-039875 |
| Feb. 22, 2001 | (JP) | 2001-046909 |
| Feb. 22, 2001 | (JP) | 2001-046910 |
| Jul. 31, 2001 | (JP) | 2001-230861 |

(51) Int. Cl.
*G01L 1/22* (2006.01)
(52) U.S. Cl. .............. 338/2; 338/47; 73/720

(58) Field of Classification Search ............... 338/2–6, 338/39, 42, 47; 73/720, 746, 862.474
See application file for complete search history.

(56) References Cited

U.S. PATENT DOCUMENTS 3,341,794 A * 9/1967 Stedman ............... 338/4

(Continued)

FOREIGN PATENT DOCUMENTS

JP         08-308204         11/1996

(Continued)

OTHER PUBLICATIONS

Preliminary examination report from corresponding PCT/JP02/01250.

(Continued)

*Primary Examiner*—Tu Hoang
(74) *Attorney, Agent, or Firm*—Harness, Dickey & Pierce, P.L.C.

(57) ABSTRACT

A stress sensor in which the direction and magnitude of a stress being applied to a post (6) bonded to or integrated with the surface of an insulating board (3) can be grasped from variation in the resistance of a plurality of resistor elements (8) being stimulated by application of the stress while suppressing variation in the shape of each resistor (2). The resistor element (8) comprises a resistor (4) formed, by screen print, between a pair of electrodes for the resistor element, i.e. circuit pattern electrodes (1), arranged on the surface of the insulating board (3). The electrode is connected, through a conductor (9), with a board terminal part (5) arranged at one end of the insulating board (3). The electrode (1) and the conductor (9) or a print accuracy adjusting member (7) have a constant height from the surface of the insulating board (3). Arrangement of the conductor (9), the electrode (1) and the print accuracy adjusting member (7) is entirely identical or similar for the plurality of resistor elements (8) in the vicinity thereof.

11 Claims, 10 Drawing Sheets

U.S. PATENT DOCUMENTS

| | | | | |
|---|---|---|---|---|
| 4,104,421 A | * | 8/1978 | Maher et al. | 427/102 |
| 4,481,497 A | * | 11/1984 | Kurtz et al. | 338/2 |
| 4,488,436 A | * | 12/1984 | Mohri et al. | 73/726 |
| 4,506,250 A | * | 3/1985 | Kirby | 338/5 |
| 4,540,463 A | * | 9/1985 | Kakuhashi et al. | 216/16 |
| 4,771,261 A | * | 9/1988 | Benini | 338/4 |
| 4,966,039 A | * | 10/1990 | Dell'Acqua | 73/727 |
| 4,974,596 A | * | 12/1990 | Frank | 600/485 |
| 5,209,122 A | * | 5/1993 | Matly et al. | 73/727 |
| 5,317,920 A | * | 6/1994 | Kremidas | 73/720 |
| 6,439,056 B1 | * | 8/2002 | Jonsson | 73/708 |
| 2001/0015720 A1 | * | 8/2001 | Inukai | 345/161 |

FOREIGN PATENT DOCUMENTS

JP    10-148590    *    6/1998

OTHER PUBLICATIONS

International Search Report—PCT/JP02/01250; ISA/JPO, completed May 9, 2002.

Patent Abstracts of Japan for JP2000-267803.

* cited by examiner (a)

(b)

(c)

(d)

(e)

(f)

(g)

(a)

(b)

(a)

(b)

(a)

(b)

PRIOR ART

RESISTOR ELEMENT, STRESS SENSOR AND METHOD FOR MANUFACTURING THEM

TECHNICAL FIELD

The present invention relates to resistor elements and stress sensors as one application filed thereof, which can be used, for example, for a pointing device for personal computers or a multifunctional and multidirectional switch for various electronic devices.

BACKGROUND ART

A stress sensor has been disclosed in Japanese Unexamined Patent Application Publication No. 2000-267803, which is capable of grasping the direction and magnitude of a stress applied to a post bonded to or integrated with a surface of an insulating board from variation in resistance of a plurality of resistor elements caused by stimulation provided thereto resulting form the application of the stress to the post. The formation of the resistor elements thus disclosed, which elements form a strain gage, is performed by screen printing of all constituent elements of the resistor elements on a surface of a ceramic board.

The structure is formed as shown in FIG. 15, in which four resistor elements 22 are disposed on two lines, which are along a surface of an insulating board 20 and perpendicularly intersect each other at the center of a surface the insulating board 20, and are provided at substantially the same distance from the intersecting point. In addition, in the structure described above, a post 30 having a square bottom surface is bonded so that the center thereof coincides with the center of the surface of the insulating board 20 and that individual sides of the bottom surface of the post 30 oppose the respective resistor elements 22. In addition, board terminal parts 24 are provided at end portions along the entire periphery of the insulating board 20 at approximately regular intervals. Since conductors (electrodes) to be connected to the resistor elements 22 and the board terminal parts 24 are formed on the surface of the insulating board 20 by a screen printing method, they have a uniform (predetermined) height from the surface of the insulating board 20.

In recent years, in addition to stress sensors having the structure in which all constituents for constituting resistor elements are formed by screen printing on a surface of a ceramic board, development of stress sensors using an insulating board provided with conductors, which are obtained by partly removing a conductor layer on a surface as remains, has also been carried out. The reasons for this is that, compared to thick film techniques such as a screen printing technique, the conductors of the insulating board described above can be easily processed to have fine patterns, and in addition, an advantage of low manufacturing cost can also be obtained.

However, when the insulating board for a stress sensor is an insulating board having conductors which are obtained by partly removing a conductive layer on a surface as remains, and when the stress sensor uses parts of the conductors 9 as electrodes and resistor elements as a strain gage, each element formed of a resistor provided between a respective pair of the electrodes on the surface of the insulating board, a problem different from that of the conventional technique described above may arise.

In the past, the electrodes (conductors) constituting the resistor elements were formed by a screen printing method, and in the above technique, the conductors are formed of the remains obtained by partly removing the conductor layer on the surface; hence, the problem is generated by the difference described above.

The difference described above is schematically shown in FIG. 7. FIG. 7(a) is a schematic cross-sectional view of a resistor element 8 using conductors (circuit pattern electrodes 1) as electrodes, which are obtained by partly removing a conductor layer on a surface of an insulating board 3. FIG. 7(b) is a schematic cross-sectional view of a resistor element 8 using conductors (resistor-element electrodes (hereinafter referred to as "thick electrodes)) obtained by screen printing, which is one of thick film techniques.

The conductor height shown in FIG. 7(a) mostly depends on the thickness of the conductor layer which is originally disposed on a surface of the insulating board 3 and is formed of copper or the like. In general, this thickness is approximately from 18 to 36 µm. In addition, when the insulating board 3 is a so-called double-sided board, in which the conductors 9 on both surfaces of the insulating board 3 are connected to each other through a conductive material formed inside a through-hole by plating, the conductive material may be further adhered to the conductors 9 by this plating, and as a result, the height thereof may be further increased to approximately 40 to 70 µm in some cases. On the other hand, the thickness of a thick film electrode 13 shown in FIG. 7(b) can be determined optionally to some extent, and is generally set to approximately 10 µm.

Next, the difference in cross-sectional shape between the circuit pattern electrode 1 and the thick film electrode 13 will be described. The circuit pattern electrode 1 has a cross-sectional shape similar to a rectangular shape, and it is understood that the circuit pattern electrode 1 has surfaces approximately perpendicular to that of the insulating board 3 (FIG. 7(a)). On the other hand, the thick film electrode 13 has a curved cross-sectional shape primarily formed of components inclined with respect to the surface of the insulating board 3, and it is understood that the thick film electrode 13 is primarily composed of surfaces smooth with respect to the surface of the insulating board 3 (FIG. 7(b)).

Due to the difference between the circuit pattern electrode 1 and the thick film electrode 13, compared to the resistor element 8 (FIG. 7(b)) using the thick film electrodes 13 as the electrodes, the resistor element 8 (FIG. 7(a)) using the circuit pattern electrodes 1 as the electrodes has a large variation in resistance. The reason for this is that it is difficult for the former to form a resistor 2 having a uniform shape. When the variation in resistance is large, in a so-called trimming step in which adjustment is performed to obtain a desired resistance, a resistor element 8 in which an excessively long trimming groove must be formed and a resistor element 8 in which a trimming groove is not substantially necessary are both present at the same time. Although the resistances are equal to each other, when the trimming lengths are extremely different from each other as described above, due to the change in ambient environment, particularly an ambient temperature, the resistance stability cannot be obtained. That is, even when the nominal resistances are the same, in this case, resistor elements 8, in which the variation in various properties other than the resistance is large, are formed. In addition, in a stress sensor in which resistor elements 8 having trimming grooves are used as a strain gage, minute cracks around the trimming grooves will grow by the use for a long period of time, and as a result, the original resistance may not be maintained in some cases.

As described above, compared to the case in which the thick film electrodes 13 are used, when the circuit pattern electrodes 1 described above are used, the shape of the resistor 2 having a large thickness formed between the electrodes by a thick film technique such as a screen printing technique becomes unstable, and it has been, believed that there are two reasons for this problem.

The first reason is that the height of the circuit pattern electrode 1 is large as described above. For example, in the case in which a film for the resistor 2 is formed by a screen printing method, an approximately predetermined amount of a resistor paste which passed through a mask (screen) is supplied between a pair of the circuit pattern electrodes 1. Depending on various factors such as an ambient temperature, a paste temperature, and a holding time for fixing the shape of the resistor 2 obtained by firing or curing performed after screen printing, the shape of the fixed resistor 2 varies. For example, due to a high ambient temperature or the like, when the paste viscosity is low, the upper surface of the resistor 2 between a pair of the circuit pattern electrodes 1 becomes approximately flat, and as a result, a relatively stable shape is obtained. On the other hand, when a paste having a high viscosity is supplied between a pair of the circuit pattern electrodes 1, the paste is solidified by firing/curing while maintaining the original shape, which is formed when the paste is supplied, to some extent. It has been believed that this phenomenon becomes apparent when the resistor paste contains a thermosetting resin. The reason for this is believed that decrease in paste viscosity is not likely to occur even when the paste is heated. When the height of the circuit pattern electrode 1 is large, an area around the circuit pattern electrode 1 becomes a paste easy-flow region when the viscosity of the resistor paste is high. The reason for this is that the paste in the vicinity of the peak of the circuit pattern electrode 1 moves from a higher position to a lower position by its own weight.

In addition, in the case in which the film for the resistor 2 is formed by a screen printing method and in which the height of the circuit pattern electrode 1 is excessively large, when the resistor paste is allowed to pass through a mask by a squeegee, the squeegee is likely to collide against the circuit pattern electrode 1. Hence, the squeegee supplies the resistor paste through the mask in an irregular manner, resulting in the variation in amount of the resistor paste supplied through the mask and, in addition, in the deviation of the position at which the resistor paste is supplied. Accordingly, the phenomenon in which the shape of the resistor 2 formed between the circuit pattern electrodes 1 is unlikely to be stable becomes more serious.

The second reason is that the circuit pattern electrode 1 has a surface approximately perpendicular to the surface of the insulating board 3. It has been very difficult to control the resistor 2 present on the approximately perpendicular surface to have a predetermined thickness. The reason for this is that, as described above, when the paste in the vicinity of the peak of the circuit pattern electrode 1 moves from a higher position to a lower position by its own weight, it is difficult to estimate how the paste moves along the approximately perpendicular surface. In addition to the presence of the approximately perpendicular surface, the second reason described above makes the shape of the resistor 2 unstable in combination with the first reason. That is, when the height of the circuit pattern electrode 1 is small, the distance is small along which the paste in the vicinity of the peak of the circuit pattern electrode 1 described above moves by its own weight from a higher position to a lower position, and as a result, the variation in resistance caused by the difference of the thickness of the resistor 2 on the approximately perpendicular surface from that in the direction perpendicular thereto is small enough to be ignored.

This second reason is not only applied to the film formation of the resistor 2 by a thick film technique such as screen printing but is also applied to that of the film of the resistor 2 for the resistor element 8 by a thin film technique such as sputtering. The reason for this is that, for example, when sputtering is performed for the circuit pattern electrode 1 having a large height and an approximately perpendicular surface, it is difficult to control the thickness of the resistor 2 adhered to this perpendicular surface to be a predetermined value. That is, even in the film formation of the resistor 2 by a thin film technique, it is difficult to control the shape of the resistor 2 to be uniform, and as a result, the variation in resistance is liable to occur.

Accordingly, an object of the present invention is to decrease the variation in resistance of a resistor element having a resistor film formed between a pair of electrodes on a surface of the insulating board 3, the electrodes being parts of conductors obtained as the remains by partly removing a conductor layer on the surface of the insulating board. In addition, the present invention provides a stress sensor using the resistor elements described above.

DISCLOSURE OF INVENTION

Referring to FIG. 1, hereinafter, stress sensors having structures 1a to 1d of the present invention will be described. In order to achieve the objects described above, the stress sensor having structure 1a of the present invention is a stress sensor in which the direction and magnitude of a stress applied to a post 6 bonded to or integrated with a surface of an insulating board 3 can be grasped from variation in resistance of a plurality of resistor elements 8 caused by stimulation resulting from the application of the stress to the post 6. In the stress sensor described above, the resistor elements 8 are each composed of a resistor 2 formed by a screen printing method between a pair of resistor-element electrodes (circuit pattern electrodes 1); the resistor-element electrodes are connected to board terminal parts 5, provided at one end of the insulating board 3, through conductors 9; the resistor-element electrodes and the conductors 9 have a predetermined height from the surface of the insulating board 3; and for all the plurality of resistor elements 8, the arrangements of the conductors 9 and the resistor-element electrodes, in the vicinities of the respective resistor elements, are equal or similar to each other.

In addition, in order to achieve the objects described above, the stress sensor having structure 1b of the present invention is a stress sensor in which the direction and magnitude of a stress applied to the post 6 bonded to or integrated with a surface of the insulating board 3 can be grasped from variation in resistance of the plurality of resistor elements 8 caused by stimulation resulting form the application of the stress to the post 6. In the stress sensor described above, the resistor elements 8 are each composed of the resistor 2 formed by a screen printing method between a pair of the resistor-element electrodes (circuit pattern electrodes 1); the resistor-element electrodes are connected to the board terminal parts 5, provided at one end of the insulating board 3, through the conductors 9; the resistor-element electrodes and the conductors 9 or print accuracy adjusting members 7 have a predetermined height from the surface of the insulating board 3; and for all the plurality of resistor elements 8, the arrangements of the conductors 9 and the resistor-element electrodes or the print accuracy adjusting members 7, in the vicinities of the respective resistor elements, are equal or similar to each other.

According to structures 1a and 1b of the present invention, that is, for all the plurality of resistor elements, since the arrangements of the conductors 9 and the resistor-element electrodes (circuit pattern electrodes 1) or the print accuracy adjustment members 7, in the vicinities of the respective resistor elements, are equal or similar to each other, the conductors 9 and the resistor-element electrodes or the print accuracy adjusting members 7, which form one stress sensor, provided on the entire insulating board 3 can be disposed in a well-balanced manner. Hence, uniform squeegee movement in screen printing of the resistor 2 and uniform squeegee shape in supplying a resistor paste between a pair of the circuit pattern electrodes 1 on the surface of the insulating board 3 can be obtained for each resistor 2. Accordingly, the variation in shape of the resistors 2 in one stress sensor can be suppressed, and as a result, the objects of the present invention can be achieved. A material for a general squeegee is a rubber-based material, and the shape thereof is easily and elastically changed. Hence, the paste is allowed to pass through opening portions of a screen.

FIG. 2(a) is a side view of a screen printing step when viewed from the side in the direction perpendicular to the squeegee movement. The state of the screen printing step, at the same timing as that shown in FIG. 2(a), is observed from between the screen and the insulating board 3 at an angle of 90° rotated along the surface thereof and is shown in FIG. 2(b). In FIG. 2(b), when a pair of the circuit pattern electrodes 1, which are the resistor-element electrodes, at the right side are compared with a pair of the circuit pattern electrodes 1 at the left side, the conductors 9 and the print accuracy adjusting members 7 are not present in the vicinity of the former, and on the other side, they are present in the vicinity of the latter. Accordingly, when the resistors 2 are screen-printed between the former circuit pattern electrodes 1 and between the latter circuit pattern electrodes 1, the squeegee movement is naturally changed, and in addition, when the resistor paste is supplied onto the surface of the insulating board 3, the squeegee shape is naturally changed between the former and the latter. Hence, when structures 1a and 1b of the present invention are used, the arrangements of the conductors 9 and the print accuracy adjusting members 7 in the vicinities of the respective circuit pattern electrodes 1 can be made to be equal or similar to each other., and as a result, uniform squeegee movement in screen printing of the resistor 2 and uniform squeegee shape in supplying the resist paste onto the surface of the insulating board 3 can be obtained.

The stimulation described above is elongation or contraction of the resistor elements 8, disposed on the insulating board 3, caused by warping thereof, or compression or release of the compression of the resistor element 8 caused by the bottom surface of the post 6 without through the insulating board 3.

In general, the stress sensor comprises a control part in which electrical properties, such as the resistance described above, are for example detected and computed, thereby functioning as a stress sensor. However, in this specification, for convenience, a portion excluding the control part described above is referred to as a "stress sensor".

In addition, "the post 6 is bonded to a surface of the insulating board 3" indicates the state in which the post 6 and the insulating board 3 are different members and are fixed together with an adhesive or the like. In addition, "the post 6 is integrated with a surface of the insulating board 3" indicates the state in which the post 6 and the insulating board 3 are, for example, integrally formed. In this specification, the "outline of the bottom surface of the post 6" in the latter case indicates a portion corresponding to that represented by the "outline of the bottom surface of the post 6" in the former case.

The resistor-element electrode described above is a material having electron conductivity and being in contact with the resistor 2 and is made of part of the conductor 9 in many cases. For example, the resistor-element electrode is the circuit pattern electrode 1.

In the case in which the conductor 9 is formed by a thick film technique using a screen printing method or the like, the predetermined height described above is several micrometers to ten and several micrometers. In the case in which the conductor 9 is formed by a thin film technique using sputtering or the like, the predetermined height is approximately several tens nanometers. In addition, in the case in which a general forming technique such as a subtract method or an additive method is used for forming the conductor 9 on a printed circuit board, the predetermined height is several to several tens micrometers. In addition, since the height has a "predetermined" level, the case in which the conductor is buried in the surface of the insulating board 3 is omitted. In addition, this "predetermined" height generally means a "uniform" height. That is, it means that, in one stress sensor, a large variation in height of the conductors or the like is not present.

The "uniform" in this specification means substantial uniformity and does not means strict uniformity. For example, the variation in amount deposited by plating is ignored. The advantage obtained from the "uniform" is that the squeegee movement becomes smoother in screen printing.

In addition, concerning the term "one end", in order to avoid the misunderstanding, that is, only one side forming the insulating board 3 is regarded as the one end, generated from the narrow interpretation of the term, major portions of structures in which the board terminal parts 5 are provided at one end of the insulating board 3 are shown in FIGS. 6(a) to (g) by way of example. That is, the "one end" indicates a relatively small region along the entire periphery of the insulating board 3.

In addition, in the above "for all the plurality of resistor elements 8, and in the vicinities of", the vicinity is a region which has a large influence on the shape of the resistor 2 obtained by resistor 2 formation using a screen printing method. In forming the resistor 2 by screen printing, a region, in which a small variation in shape of the resistor 2 occurs and the influence thereof on the stress sensor properties can be ignored, is not included in the vicinity.

In addition, the above "similar" is determined in principle in accordance with the standard in which the influence on the stress sensor properties can be ignored or not. However, shapes to be compared to each other must be reasonably similar to each other. For example, the arrangements of the circuit pattern electrodes 1 or the print accuracy adjusting members 7 and the resistors 2 in the vicinities of the four resistor elements 8, shown in FIG. 1, are similar to each other in appearance on the whole.

In addition, the print accuracy adjusting members 7 described above are members other than the conductors 9 and the resistor-element electrodes (circuit pattern electrodes 1) and are provided on the surface of the insulating board 3 whenever necessary, together with the conductor 9 and the resistor-element electrode, so as to obtain uniform squeegee movement in forming the resistors 2 by screen printing and uniform squeegee shape in supplying the resistor paste onto the surface of the insulating board 3 for each resistor 2. The material therefore may be a conductive material or an insulating material.

The print accuracy adjusting members 7 are preferably formed together with the conductors 9 and the resistor-element electrodes (circuit pattern electrodes 1) since approximately uniform height can be obtained, and the manufacturing can be easier performed. For example, when these three members are formed by screen printing, these three members are patterned (formation of opening portions) in one screen plate. In addition, when patterned by a so-called subtract method, these three members are arranged to be obtained by one etching operation as is the case described above.

In addition, in order to achieve the objects described above, the stress sensor having structure 1c of the present invention is a stress sensor in which the direction and magnitude of a stress applied to the post 6 bonded to or integrated with a surface of the insulating board 3 can be grasped from variation in resistance of a plurality of the resistor elements caused by stimulation resulting from the application of the stress to the post 6. In the stress sensor described above, the resistor elements are composed of the resistors 2 formed by a screen printing method between pairs of the resistor-element electrodes (circuit pattern electrodes 1) disposed on a surface of the insulating board 3; the resistor-element electrodes are connected to the board terminal parts 5 provided at one end of the insulating board 3 through the conductors 9; and the resistor-element electrodes and the conductors 9 or the print accuracy adjusting members 7 have a predetermined height from the surface of the insulating board 3; and for all the plurality of resistor elements, the arrangements of the conductors 9 and the resistor-element electrodes (circuit pattern electrodes 1) or the print accuracy adjusting members 7, in the vicinities of the respective resistor elements, are each formed so as to surround at least three sides of the periphery of each of the respective resistors 2.

The feature of structure 1c of the present invention as compared to structures 1a and 1b of the present invention described above is as follows. In the latter structure, for all the plurality of resistor elements, the arrangements of the conductors 9, the resistance-element electrodes (circuit pattern electrodes 1) or the print accuracy adjusting members 7, in the vicinities of the respective resistance elements, are equal or similar to each other, and on the other hand, in the former structure, for all the plurality of resistor elements 8, the arrangements of the conductors 9, the resistance-element electrodes (circuit pattern electrodes 1) or the print accuracy adjusting members 7, in the vicinities of the respective resistance elements, are each formed so as to surround at least three sides of the periphery of each of the resistors 2. The meanings of the terms, operations of the individual constituent elements, and the like of the other points are common to all the structures. In addition, it is naturally understood that the combination of structure 1c and structure 1a or 1b is not denied. For example, the four resistor elements 8 shown in FIG. 1 have structure 1a, structure 1b, and structure 1c in combination.

The above "periphery of the resistor 2" is a region in the vicinity of the end portion of the resistor, which has a large influence on the resistor 2 shape formed by resistor 2 formation using a screen printing method, and including the outside of the vicinity described above. The region described above is, for example, approximately a region in the vicinity at which the resister-element electrodes (circuit pattern electrodes 1) are in contact with the resistor 2 shown in FIG. 1 or a region including the outside of the region described above, that is, a region in the vicinity at which the conductor 9 and the print accuracy adjusting member 7 are close to the resistor 2. In forming the resistor 2 by screen printing, a region, which causes a small variation in shape of the resistor 2 so that the influence thereof on the stress sensor properties can be ignored, is not included in the region described above.

The uniform squeegee movement in forming the resistors 2 by screen printing and the uniform squeegee shape in supplying a resistor paste onto the surface of the insulating board 3 can be achieved for each resistor 2 by using structure 1c. The reason for this is that since the arrangements of the conductors 9 and the resistor-element electrodes (circuit pattern electrodes 1) or the print accuracy adjusting members 7 each surround at least three sides of the periphery of each of the respective resistors 2, at least in the vicinities at which the resistors 2 are formed by printing, there are a great number of contact points between the squeegee and the conductors 9 and the resistor-element electrodes or the print accuracy adjusting members 7 with a screen provided therebetween, the contact points being continuously provided in many cases. As a result, the contact points described above contribute to the improvement in uniformity of the squeegee movement and the squeegee shape in supplying the resistor paste onto the surface of the insulating board 3 for each resistor 2.

In addition, in order to achieve the objects described above, the stress sensor having structure 1d of the present invention is a stress sensor in which the direction and magnitude of a stress applied to the post 6 bonded to or integrated with a surface of the insulating board 3 can be grasped from variation in resistance of a plurality of the resistor elements 8 caused by stimulation resulting from the application of the stress to the post 6. In the stress sensor described above, the resistor elements 8 are composed of the resistors 2 formed by a screen printing method between pairs of the resistor-element electrodes (circuit pattern electrodes 1) disposed on a surface of the insulating board 3, the circuit pattern electrodes 1 are connected to the board terminal parts 5 provided at one end of the insulating board 3 through the conductors 9, and the circuit pattern electrodes 1 and the conductors 9 or the print accuracy adjusting members 7 have a predetermined height from the surface of the insulating board 3. In addition, the circuit pattern electrodes 1 and the conductors 9 or the print accuracy adjusting members 7 are disposed so as to intermittently or continuously surround all the plurality of resistor elements.

The feature of structure 1d of the present invention as compared to structure 1c of the present invention described above is as follows. In the latter structure, the conductors 9 and the resistor-element electrodes (circuit pattern electrodes 1) or the print accuracy adjusting members 7 are provided so as to surround the respective resistor elements, and on the other hand, in the former structure, the conductors 9 and the resistor-element electrodes or the print accuracy adjusting members 7 are provided so as to collectively surround the plurality of resistor elements. The meanings of the terms, operations of the individual constituent elements, and the like of the other points are common to all the structures. In addition, it is naturally understood that the combination of structure 1d and structures 1a and/or structure 1b and/or structure 1c is not denied. The combination described above is more preferable since the advantages thereof may be favorably enhanced.

In these structures 1a to 1d described above, as the constituent elements of the stress sensors, the resistor-element electrodes (circuit pattern electrodes 1), the conductors 9, or the print accuracy adjusting members 7 are preferably formed by adhering a metal foil to the surface of the insulating board 3 followed by etching treatment performed for unnecessary parts of this metal foil. Compared to the case in which the resistor-element electrodes, the conductors 9, or the print accuracy adjusting members 7 are formed on the surface of the insulating board 3 by a general thick film or thin film technique such as screen printing or sputtering, the height of the resistor-element electrodes, the conductors 9, or the print accuracy adjusting members 7 from the surface of the insulating board 3 is large as described above. The reason for this is that the thicknesses thereof depend on the thickness of the metal foil described above, or that in an electroless plating step in which a conductive film is formed on inner walls of thorough-holes, the conductive film is also deposited on the metal foil. The thickness of the current metal foil is approximately 9 to 36 µm, and a foil having a thickness of approximately 18 µm is generally used. When the electroless plating step described above is performed, the height of the circuit pattern electrodes 1, the conductors 9, or the print accuracy adjusting members 7 from the surface of the insulating board 3 is generally 30 to 50 µm. When the circuit pattern electrodes 1, the conductors 9, or the print accuracy adjusting members 7, having a large height from the surface of the insulating board 3, are used, it is particularly difficult to obtain uniform squeegee movement in forming the resistors 2 by screen printing and uniform squeegee shape in supplying the resistor paste onto the surface of the insulating board 3 for each resistor 2, and hence, the application of the present invention can significantly contribute to the improvement in stress sensor properties.

This significant contribution can be obtained when the height of the resistor-element electrodes (circuit pattern electrodes 1), the conductors 9, or the print accuracy adjusting members 7 is 10 µm or more, more significant contribution can be obtained when the height is 20 µm or more, and even more significant contribution can be obtained when the height is 30 µm or more.

In addition, in order to achieve the objects described above, a method for manufacturing a stress sensor, according to the present invention, is a method for manufacturing a process sensor in which the direction or magnitude of a stress applied to the post 6 bonded to or integrated with a surface of the insulating board 3 can be grasped from variation in resistance of a plurality of the resistor elements 8 caused by stimulation resulting from the application of the stress to the post 6. The method described above comprises a first step of forming the circuit pattern electrodes 1, the board terminal parts 5, and the conductors 9 so that the resistor-element electrodes (circuit pattern electrodes 1) are connected to the board terminal parts 5 provided at one end of the insulating board 3 through the conductors 9; a second step of providing an insulating film on a surface of the insulating board 3 so as not to cover at least the circuit pattern electrodes 1; and a third step of forming the resistors 2 by a screen printing method between pairs of the circuit pattern electrodes 1 provided on the surface of the insulating board 3, wherein the first step, the second step, and the third step are performed in that order.

The first step described above can be realized by a screen printing method in which a conductive paste is applied onto the surface of the insulating board 3 formed of alumina or the like; a so-called subtract method in which a copper foil is adhered to a molded plate of a glass fiber filled epoxy resin, followed by etching to remove areas other than those necessary as the conductors 9; or a so-called additive method, a plating method, or the like in which the conductors 9 are deposited on necessary areas.

In order to obtain the uniform squeegee movement in forming the resistors 2 by the screen printing in the subsequent third step and the uniform squeegee shape in supplying the resistor paste onto the surface of the insulating board 3 for each resistor 2, the second step described above is a step of adjusting the height of the resistor-element electrodes, the board terminal parts 5, and the conductors 9 from the surface of the insulating board 3. That is, as described above, when the height of the resistor-element electrodes, the conductors 9, or the print accuracy adjusting members 7 from the surface of the insulating board 3 is larger, in other words, when the difference in height of a surface of a workpiece, which is to be printed and to be brought into contact with a squeegee for screen printing with a screen provided therebetween, is larger, it becomes more difficult to obtain the uniform squeegee movement. Accordingly, in order to decrease or eliminate the difference in height described above, the level of the surface of the insulating board 3 is increased so as to be closer to the height of the resistor-element electrode or the conductor 9 or to exceed the height thereof by forming the insulating film over the conductors 9.

In the case in which a stress applied to the post 6 warps the insulating board 3, the resistor elements 8 are then warped thereby, and the stress sensor detects the variation in resistance of the resistor elements 8 thus warped, the insulating film described above is preferably formed of a material softer than the insulating board 3. The reason for this is that when the insulating film is a material having high rigidity as compared to that of the insulating board 3, the warping of the insulating board 3 may be inhibited in some cases. For example, when the material for the insulating board 3 is a molded body of a glass fiber filled epoxy resin, a cured silicone resin paste or the like may be preferably used. In this case, for example, the paste is applied by screen printing or the like so as to cover the surface of the insulating board 3 and the conductors 9 provided thereon. Accordingly, the paste on the conductors 9, provided at the higher position, flows to the surface of the insulating board 3 located at the lower position and is then cured by heating to form an insulating film, and hence the difference in height described above can be decreased or eliminated. In this step, attention must be paid so that the paste is not applied onto the surfaces of the resistor-element electrodes (circuit pattern electrodes 1). The reason for this is that the presence of a material which may interfere with the electrical connection with the resistors 2 formed in the subsequent step is avoided. In this specification, the surface of the resistor-element electrodes includes the top surface and/or the side surfaces thereof. Hence, when the top surface of the resistor-element electrode is exposed, of course, the insulating film may be disposed in some cases between the electrodes at which the resistor 2 is to be provided.

Means for not applying the paste on the surfaces of the circuit pattern electrodes 1 may comprise, for example, performing masking treatment in which the contact between the paste and the circuit pattern electrodes 1 is inhibited, and removing the mask after the paste is cured. Alternatively, for example, after the paste is applied onto the surfaces of the circuit pattern electrodes 1 and curing thereof, the paste is removed by polishing the surfaces of the circuit pattern electrodes 1.

A first structure of the resistor element 8 of the present invention, which achieves the objects described above, comprises: electrodes (circuit pattern electrodes 1) composed of parts of the conductors 9 on a surface of the insulating board 3 obtained by partly removing a conductive layer on the surface as remains or by an additive method; and the resistor 2 formed by film formation between a pair of the circuit pattern electrodes 1 on the surface of the insulating board 3. In the structure described above, the ratio L/h of the distance (L) between the pair of the electrodes to the electrode height (h) is 30 or more.

In FIG. 9, positions at which the distance (L) between the electrodes and the electrode height (h) are measured are shown. As means for obtaining a ratio L/h of 30 or more, for example, there may be mentioned means for decreasing the electrode height (h) and means for increasing the distance (L) between the electrodes. In addition, of course, the means described above may be used in combination.

By the means for decreasing the electrode height (h), the variation in resistance of the resistor elements 8 caused by the first reason and the second reason described above can be decreased. In addition, when a ratio L/h of 30 or more is obtained by this means, even in the resistor elements 8, each comprising the electrodes (circuit pattern electrodes 1) composed of parts of the conductors 9 obtained by partly removing the conductive layer on the surface as the remains or by an additive method; and the resistor 2 formed by film formation between the pair of the circuit pattern electrodes 1 on the surface of the insulating board 3, the variation in resistance can be decreased.

When the electrode height (h) is decreased, in the structure in which the top surface of the circuit pattern electrode 1 is at the same level of the surface of the insulating board 3 or in the structure in which the top surface of the circuit pattern electrode 1 is located at a lower level than the surface of the insulating board 3, said h becomes 0 or less, and as a result, the ratio L/h cannot be 30 or more. However, even in the case described above, since the same advantage as that of the first structure described above can be obtained, in the present invention, the case in which said h is 0 or less is also included in the structure of the present invention.

In addition, in the case in which a ratio L/h of 30 or more is obtained by the means for increasing the distance (L) between the electrodes, due to the first and the second reasons described above, even when the variation in shape of the resistor 2 in the vicinities of the circuit pattern electrodes 1 occurs, the variation can be decreased so as to be ignored. That is, in each of the resistor 2 provided between the pair of the circuit pattern electrodes 1, when the ratio of part of the resistor 2 provided at a relatively distant position from the surfaces of the circuit pattern electrodes 1 and having a relatively reproducible shape is increased, the variation in resistance of the resistor elements 8 can be decreased. In other words, among the factors determining the resistance, including an unstable factor (part of the resistor 2 provided in the vicinities of the circuit pattern electrodes 1) and a stable factor (part of the resistor 2 provided at a distant from the surfaces of the circuit pattern electrodes 1 and having a relatively reproducible shape), when the ratio of the stable factors is increased, the variation in resistance of the resistor elements 8 can be suppressed.

In the resistor element 8 having the first structure of the present invention, the technical meaning in which the ratio L/h is set to 30 or more is based on the experimental result. When the ratio L/h was set to approximately 24, the variation in resistance of the resistor elements 8 was in a range of ±17% (n=30). Hence, in the case in which the ratio L/h was set to approximately 30, the variation in resistance of the resistor elements 8 was in a range of ±9% (n=30). In addition, when the ratio L/h was set to approximately 40, 45, 50, 55, and 60, the variation in resistance is slightly decreased in that order; however, the variation described above is not so significantly different from that obtained when the ratio L/h was set to approximately 30. This is the process and the reason for determining that "the ratio L/h is 30 or more".

A method for manufacturing the resistor element having the first structure of the present invention, for achieving the objects of the present invention, comprises a fourth step of obtaining the conductors 9 on a surface of the insulating board 3, a fifth step of positively adjusting the height of parts or the entirety of the conductors 9, and a sixth step of, by using parts of the conductors 9 as electrodes, forming the resistor 2 by film formation between a pair of the electrodes provided on the surface of the insulating board 3, in which the fourth to the sixth steps are performed in the numerical order. In the fifth step of the method described above, the ratio L/h of the distance (L) between said pair of the electrodes to the height (h) of the conductors 9 is set to 30 or more, or said h is set to 0 or less.

As described above, the fourth step is a step, for example, of obtaining the conductor 9 layer on the surface of the insulating board 3 by removing the conductor 9 layer on the surface thereof or by an additive method.

The above fifth step is performed, for example, by a press step of pressing the surface of the insulating board 3. This step is a step of obtaining a ratio L/h of 30 or more by forcedly pressing the circuit pattern electrodes 1, which is formed to have a large height, into the insulating board 3 or deforming the circuit pattern electrodes 1 itself so that the electrode height (h) is finally adjusted to be smaller. As this press step, for example, there may be mentioned a press step of pressing the entire surface of the insulating board 3 by roller press or press with a pressure using a flat plate having no concave portions as a die, or a press step of pressing only parts of the insulating board 3 corresponding to the circuit pattern electrodes 1.

In addition, the above fifth step may be a step, for example, of polishing the surface of the insulating board 3 or performing acid treatment thereof. This step is a step of finally decreasing the height (h) of the circuit pattern electrodes 1 through adjustment by mechanical polishing, for example, using an abrasive paper or by immersing the insulating board 3 in an acidic solution for dissolution of a metal so that the ratio L/h is set to 30 or more. In this step, when the insulating board 3 is used having the structure in which conductors 9 patterns on two surfaces of the insulating board 3 are connected to each other through a conductive material provided in through-holes, the through-hole portions are preferably masked so as not to be brought into contact with the acidic solution for preventing the conductive material in the through-holes from being excessively dissolved.

When the first structure of the resistor element 8 of the present invention comprises a potion at which circuit patterns on two surfaces of the insulating board 3 are connected to each other with a conductive material provided in a through-hole, and the resistor 2 formed by film formation between a pair of electrodes on the surface of the insulating board 3, the electrodes formed of parts of the conductors 9 on the surface thereof, the electrode height (h) may be particularly increased in some cases, and hence the present invention is preferably used. The reason the electrode height (h) may be increased is that in a manufacturing method of a so-called double-sided circuit board, in order to form conductive layers on inner walls of through-holes of the insulating board 3 so that wires on two surfaces thereof are connected to each other, an electroless plating step is performed. As a result, the electroless plating layer thus formed is also deposited on portions which are to be formed into the circuit pattern electrodes 1.

The above fifth step including the plating step as described above may be a plating step of plating inside the through-holes formed in the insulating board 3 after the pair of the electrodes on the surface thereof is covered. Next, the electrode height (h) is adjusted to be small, and the ratio L/h is set to 30 or more.

In the present invention, of course, at least two of the fifth steps described by way of example may be used in combination.

In addition, in a second structure of the stress sensor of the present invention, the post 6 is bonded to or integrated with one of surfaces of the insulating board 3 forming all the resistor elements 8 having the first structure of the present invention, and the direction and magnitude of a stress applied to the post 6 is grasped from the variation in resistance of the resistor elements 8 resulting from the application of the stress.

In the stress sensor described above, for example, as shown in FIGS. 1 and 8, the resistor elements 8 are provided on two lines, which are along a surface of the insulating board 3 forming the resistor elements 8 and perpendicularly intersect each other at the center of a sensor effective region of a surface of the insulating board 3, and are provided at substantially the same distance from the center, and the post 6 is bonded to or integrated with a surface of the insulating board 3 so that the center thereof substantially coincides with the center of the bottom surface of the post 6. Accordingly, the direction and magnitude of a stress applied to the post 6 is grasped from the variation in resistance of the resistor elements 8 caused by elongation, contraction, or compression thereof resulting from the application of the stress.

Referring to FIG. 8, an example of the structure of the stress sensor according to the present invention will be further described. The insulating board 3 is formed, for example, of a glass fiber filled epoxy resin. On the bottom surface of the insulating board 3, four pairs of circuit pattern electrodes 1 are provided, and the resistors 2 are provided between the respective pairs of circuit pattern electrodes 1, thereby forming the resistor elements 8. The resistor elements 8 are provided on two lines, which are along the surface of the insulating board 3 and intersect perpendicularly to each other, and are provided at substantially the same distance from the intersection described above. To the top surface of the insulating board 3, the post 6 is fixed with an adhesive or the like, in which the bottom surface of the post has an approximately square outline. In this step, the center of the bottom surface of the post 6 is provided so as to substantially coincide with the center of the insulating board 3.

In addition, L-shaped holes 10 are formed in the insulating board 3 so that the corners of the L-shapes face the center of the insulating board 3. These holes 10 serve so as to allow the insulating board 3 to be easily warped by a stress applied to the post 6 and to efficiently propagate the stress to the individual resistor elements 8. That is, in the case in which a stress is applied to the post 6 when the holes 10 are not provided, in addition to insufficient warpage of the insulating board 3, the stress applied in an optional direction may also be propagated to the resistor element 8 provided in a different direction therefrom in some cases, and hence the holes 10 are preferably formed.

In addition, trimmable chip resistors 11 which are to be connected to the respective resistor elements 8 in series are provided on the top surface of the insulating board 3. The resistor elements 8 on the bottom surface of the insulating board 3 and the trimmable chip resistors 11 on the top surface of the insulating board 3 are electrically connected through through-holes (via holes), not shown in the figure, formed in the insulating board 3. When it is difficult to adjust the resistance of each resistor element 8 in a predetermined range, the trimmable chip resistor 11 is used so that the sum of the resistances of the resistor element 8 and the trimmable chip resistor 11 is adjusted in a predetermined range by trimming the trimmable chip resistor 11 using a laser trimmer or the like. The electrical connection state of the trimmable chip resistors 11 and the resistor elements 8 is shown in FIG. 4 by way of example. Electrical signals from the stress sensor are output through the board terminal parts 5.

Support holes 12 are used for fixing the stress sensor to a housing of an electronic device or the like. In the fixed state obtained thereby, the peripheral portions of the insulating board 3 outside the holes 10 become non-deformable portions which are not substantially deformed even when a stress is applied to the post 6, and the insides of the holes 10 become deformable portions which are deformed when a stress is applied to the post 6 so as to elongate and contract the resistor elements 8. The trimmable chip resistors 11 are preferably provided in the non-deformable portions so that the resistances thereof are not varied by the influence of the deformation of the insulating board 3.

The meanings of the terms used for the stress sensor having the second structure are equivalent to those used for the stress sensors having structures 1a to 1d. In addition, of course, the combination of the second structure and structures 1a to 1d is not denied. The combination described above is more preferable since the advantages thereof may be favorably enhanced.

In the structure shown in FIG. 8, the holes 10, the support holes 12, and the trimmable chip resistors 11 are particularly optional constituent elements (not essential elements) of the stress sensor having the second structure. Even when those described above are included in the constituent elements, the shape of the hole 10 is not limited to an L shape, and the positions at which the support holes 12 are provided are not limited to the four corners of the insulating board 3 having a square outline. The shape of the hole 10 may be optionally changed, for example, into a circular, a square, or a rounded square shape, in accordance with design limitation, required functions, applications, and the like. In addition, the support holes 12 may be provided at an approximately center of each side of the square insulating board 3 shown in FIG. 8.

In the structure shown in FIG. 1 or 8, the bottom surface of the post 6 and a part or the entirety of the resistor elements 8 may overlap each other without the insulating board 3 provided therebetween. In this case, the post 6 and the resistor elements 8 are provided on the same surface of the insulating board 3. This structure has an advantage in that the sensibility of the resistor elements 8 can be enhanced. The reason for this is that most of the stress applied to the post 6 directly stimulates the resistor elements 8 from the bottom surface of the post 6 not through the insulating board 3. As a result of this stimulation, the resistor 2 portions of the resistor elements 8 are compressed, and hence the resistance, which is the property of the resistor, is largely varied. When the stimulation is removed, the resistor portions thus compressed are elongated, and hence the resistance returns to the original value.

The further advantage of the structure in which the resistor elements 8 are provided on and the post 6 is bonded to the same surface of the insulating board 3 is that the stress sensor of the present invention can be manufactured by performing mounting operation only on one side surface of the insulating board 3. The mounting operation mentioned above includes, for example, operation of providing the resistors 2 and operation of bonding the post 6 to the surface of the insulating board 3 with an adhesive or the like. In the case in which the mounting is performed on two surfaces of the insulating board 3, while mounting is performed on one surface of the insulating board 3, a position at which the other surface of the insulating board 3 is placed must be controlled under strict conditions in terms of cleanness, softness, and the like. On the other hand, when the mounting is performed on the same surface of the insulating board 3, the control under the strict conditions described above is not necessary. Another advantage is that the alignment of the resistor elements 8 and the post 6 can be easily performed. The positional relationship between the resistor elements 8 and the post 6 is a significantly important factor that determining the stress sensor properties.

For example, in FIG. 8, when the position of the post 6 is largely deviated with respect to the positions of the resistor elements 8, the stress applied to the post 6 is propagated in a different manner to each of the individual resistor elements 8. In the case in which the post 6 and the resistor elements 8 are mounted on different surfaces of the insulating board 3, when one surface of the insulating board 3 is visually observed, the other surface thereof cannot be observed. Hence, it is difficult to understand the positional relationship between the post 6 and the resistor elements 8, and as a result, the positional deviation therebetween is liable to occur. However, when the mounting is performed on the same surface of the insulating board 3, the relative positional relationship between the post 6 and the resistor elements 8 is very easily grasped, and hence the positional deviation is unlikely to occur. In addition, visual inspection can be easily performed when an element which was disposed at a deviated position is removed.

In addition, in the structure shown in FIG. 1 or 8, a protection film covering at least the resistor elements 8 is preferably provided. The protection film is made of a material softer than that for the insulating board 3, and as the material mentioned above, for example, there may be mentioned a silicone resin material or a rubber-based material. The soft material has an effect of suppressing decrease in adhesion between the insulating board 3 and the resistor elements 8 caused by repeated warping (elongation and contraction) of the resistor elements 8 following the warping of the insulating board 3.

In addition, in the structures shown in FIGS. 1 and 8, a material for the post 6 can be selected from a metal, a ceramic, a resin, or a fiber reinforced resin. The advantage obtained when a metal such as iron or high carbon steel is used for the post 6 is that a stress applied can be accurately propagated to the resistor elements 8 by the rigidity of the metal. In addition, a first advantage obtained when a resin or a glass fiber reinforced resin is used for the post 6 is that when the production thereof is performed, less energy is consumed. For example, a temperature for molding and curing a resin or a glass fiber reinforced resin is very low as compared to a sintering temperature for a ceramic and a casting temperature for a metal. A second advantage is superior moldability to that of ceramic and metal. For example, when a post 6 having a complicated shape is formed, cracking may occur in ceramic during a molding or sintering step and in metal during a casting step in some cases. The reason for this is that, during cooling, the rigidity material cannot easily follow the volume contraction thereof caused by a temperature change from a very high temperature to room temperature. On the contrary, when a resin of a glass reinforced resin is used, since a melting temperature of a resin is very low as compared to the sintering temperature and the casting temperature described above, and in addition, the rigidity of a resin is low as compared to that of a metal or ceramic, the problem described above may not occur at all.

This post 6 may be used when the stress sensor of the present invention is applied to a pointing device of a personal computer or a multifunctional and multidirectional switch for various electronic devices such as a mobile phone, in particular, a compact mobile phone. In the case in which the stress sensor of the present invention is used as the multifunctional and multidirectional switch described above, in order to enable an operator to recognize by feeling a direction in which a stress is to be applied, it is preferable that a cross-sectional shape of a side surface of the post 6 be polygonal so that each order can be transmitted to the electronic device by applying a stress perpendicular to each flat surface formed on the side surface of the post 6. When the complication of forming the post 6 having the cross-sectional polygonal shape described above is taken into consideration, the post 6 is preferably formed of a resin or a glass reinforced resin as described above.

In addition, as a material when a resin is used, in particular, poly(vinyl terephthalate) (PVT) or poly(butylene terephthalate) (PBT) is preferably used. Since these PVT and PBT have superior rigidity among resin materials, an advantage is obtained in that a stress applied can be relatively accurately propagated. In addition, since the heat stability is also superior, even under the conditions at a temperature slightly higher than room temperature, an advantage in that the rigidity described above is maintained can also be obtained.

In addition, in the structures shown in FIGS. 1 and 8, a material forming the insulating board 3 may be selected, for example, from a material primarily composed of a resin, a metal covered with a non-conductive material, and a ceramic. As the material primarily composed of a resin, for example, a phenol resin itself, or a fiber reinforced resin such as a molded body made of a glass fiber filled epoxy resin may be mentioned. As the metal covered with a non-conductive material, for example, an iron or an aluminum plate covered with a polyethylene resin may be mentioned. As the ceramic mentioned above, for example, alumina may be used. In addition to flexibility enough to be warped to some extent, the insulating board 3 is also necessary to have both rigidity and elasticity so as to be able to recover its own shape when a stress repeatedly applied thereto is removed, and all the materials described above by way of example can satisfy the above requirements.

The reason the stress sensor having the second structure comprises the resistor elements 8 having the first structure according to the present invention as the constituent elements will be described. The stress sensor of the present invention grasps the direction and magnitude of a stress applied to the post 6 from the variation in resistance of the resistor elements 8 resulting from the application of the stress. Hence, when the resistor elements 8 are formed in a very different manner from each other, problems of the balance and stability of output properties of the stress sensor may arise. For example, when the individual resistor elements 8 are resistor elements which are directly trimmed, and the lengths of trimming grooves thereof are largely different from each other, an element having a larger groove length has a higher sensitivity. In addition, a resistor element 8 having a high sensitivity easily causes deviation in resistance from the original value by the use for a long period of time. According to those described above, it is preferable that the variation in resistance of the individual resistor elements 8 be decreased as small as possible before the formation of the trimming grooves so that the length of the trimming groove is uniformly formed. Hence, as the resistor element 8 of the present invention, when resistor elements having small variation in resistance from the formation thereof are used as the constituent elements, a significant advantage can be obtained. By the same reason as described above, a stress sensor composed of the second structure in combination with one of structures 1*a* to 1*d* is more preferable.

In addition, even in the case of a stress sensor having the structure in which the adjustment of resistance is indirectly performed, that is, in which the individual resistor elements 8 are not directly trimmed and the trimmable chip resistors 11 are trimmed as described above, when the variation in length of the trimming grooves of the trimmable chip resistors 11 is large, due to ambient environments, problems of the balance and stability of output properties of the stress sensor may arise. For example, the resistance of a trimmable chip resistor 11 having a longer trimming groove is likely to be varied by an ambient temperature. Hence, even in the case in which the resistance adjustment is performed by using the trimmable chip resistors 11, as is the case of the resistor elements 8 of the present invention, when resistor elements having a small variation in resistance from the formation thereof are used as the constituent elements, a significant advantage can be obtained.

In addition, in the latter case, the variation in resistance of the individual resistor elements 8 directly causes the variation in output (sensitivity). As a particular example, the case in which the four resistor elements 8 forms one stress sensor shown in FIG. 8 will be described. The resistance of resistor element A is set to R, and the resistance of another resistor element B is assumed to be one-half of that of resistor element A, i.e., R/2. When the insulating board 3 is warped so that the warpage of resistor element A and that of resistor element B are equal to each other, if the resistance of resistor element A becomes twice, the resistance of resistor element B also becomes twice. As a result, the resistance of resistor element A becomes 2×R, and the resistance of resistor element B becomes R. Accordingly, the change in resistance of resistor element A is R, and the change in resistance of resistor element B is R/2. When the same stress is applied to resistor elements having different resistances, as described above, the rate of change in resistance is equal to each other; however, the difference of change in resistance between the two resistor elements is twice. In general, a stress sensor using resistor elements as a strain gage outputs the change in resistance as the magnitude of a stress. Accordingly, as is the case of the resistor elements 8 of the present invention, when resistor elements having a small variation in resistance from the formation thereof are used as the constituent elements, a significant advantage can be obtained.

A third stress sensor of the present invention for achieving the objects described above is a stress sensor comprising the resistor elements 8 provided on a surface of the insulating board 3 having the conductors 9 obtained by partly removing a conductor layer of the surface as remains or by an additive method; and the post 6 bonded to or integrated with one of surfaces of the insulating board 3, in which the direction and magnitude of a stress applied to the post 6 is grasped from variation in resistance of the resistor elements 8 resulting from the application of the stress. In the stress sensor described above, the resistor elements 8 are composed of the electrodes for the resistor element 8 formed by film formation so as to be electrically connected with the conductors 9 and the resistors 2 formed by thick film formation between the electrodes for the resistor element 8, and the resistors 2 are primarily in contact with flat portions of the electrodes for the resistor element 8.

According to the third structure described above, concerning the electrodes forming the resistor elements 8, the two reasons, that is, the height is large (first reason), and the surface approximately perpendicular to the surface of the insulating board 3 is present (second reason), can be excluded from the structure of the present invention, and as a result, the variation in resistance of the resistor elements 8 can be decreased.

Since a thick film electrode 13 shown in FIG. 10 which is formed by screen printing or the like has not first and second reasons at the contact surface with the resistor 2 (FIG. 10(*b*)), the variation in resistance of the resistor elements 8 using the thick film electrodes 13 is small. However, in order to further decrease the variation in resistance, the resistor 2 is formed so as to be primarily in contact with the flat portion of the electrode for the resistor element 8 (thick film electrode 13). The reason for this is to avoid the influence of the first reason. For example, in FIG. 10(*b*), the thick film electrode 13 in the vicinity of the conductor 9 has a surface perpendicular to the insulating board 3. When the resistor 2 and the conductor 9 are formed close to each other so as to be brought into contact with each other, the first reason described above will become effective, and hence it is not preferable.

FIG. 11 is a view for illustrating the meaning of the flat portion to some extent. The thick film electrode 13, which is the resistor-element electrode, is divided into three cross-sectional regions a, b, and c. Region a is substantially similar to the appearance of the conductor 9, and when the resistor 2 is provided in this region, the resistor element 8 having the first and the second reasons is obtained. Region b is mostly a flat region, and the height from the surface of the insulating board 3 is approximately 10 µm, which is generally obtained by general thick film printing (screen printing or the like). Hence, when the resistor 2 is provided in this region, the resistor element 8 having no first and second reasons is obtained. In region c, although the appearance of the thick film electrode 13 is not flat, the height from the surface of the insulating board 3 is less than 10 µm, and in addition, a smooth slope is formed. Accordingly, when the resistor 2 is provided in this region, the resistor element 8 having no first and second reasons is obtained. In this invention, the "primarily flat portion of the resistor-element electrode" indicates region b and region c in FIG. 11.

In addition, due to properties of a paste for the resistor 2 to be used, region a may not have a surface perpendicular to the surface of the insulating board 3 as sown in FIG. 11 and may include a surface primarily composed of an inclined component with respect to the surface of the insulating board 3 in some cases. In this case, a region that is substantially flat and has no first and second reasons is regarded as regions b and c. As of now, it has been empirically understood that when the shortest distance between the conductor 9 and the resistor 2 is set to approximately the height of the conductor 9 or more, the resistor element 8 having no first and second reasons can be obtained.

As described above, by setting the shortest distance between the resistor 2 and the conductor 9 to a predetermined distance (the height of the conductor 9) or more, even when the film for the resistor 2 is formed by a screen printing method as described above, the variation in amount of a resistor paste and the deviation in position thereof, caused by collision between the conductors 9 and the squeegee, can be decreased, and as a result, the shape formed between the conductors 9 can be stabilized. The reason for this is that the position at which the squeegee collides against the conductor 9 is at a distance from the position at which the resistor paste is actually provided. When the thick film electrode 13 is provided by a screen printing method, the collision between the squeegee and the conductors 9 generates some influence; however, the vicinity of the conductor 9 may be primarily influenced, and the vicinity of the contact position with the resistor 2 is unlikely to be influenced. The reason for this that since the formation of the thick film electrode 13 in the vicinity of the contact point described above is performed at a distance of not less than the shortest distance between the resistor 2 and the conductor 9, the resistor 2 is unlikely to be influenced when formed. This is the same as that described in the above case in which when the film for the resistor 2 is formed, it is unlikely to be influenced. In addition, even when the connection states between the conductors 9 and the thick film electrodes 13 vary to some extent from each other, due to the lower intrinsic resistance thereof, the variation in resistance of the resistor element 8 is not substantially influenced.

Another advantage of forming the resistors 2 and the thick film electrodes 13, which constitute the resistor elements 8 used as a strain gage of a stress sensor, by film formation is a high adhesive strength therebetween. The adhesion between the conductor 9 and the resistor 2 is low, and when a stress is repeatedly applied many times to the interface between the conductor 9 and the resistor 2 during stress sensor operation, the probability of separation thereof at the interface cannot be denied. In contrast, it has been believed that the interface between the resistor 2 and the thick film electrode 13 may not be separated at all even when general use conditions are continued for a long period of time. In this case, as the resistor 2 and the thick film electrode 13, a metal glaze-based material and a resin-based material are both included. In particular, when the resistor 2 and the thick film electrode 13 are both made of a resin-based material, high adhesion at the interface, superior response to an applied stress because of elasticity of the resin, and superior recovery when an applied stress is removed can be obtained as compared to those made of other materials. Hence, as a material forming the resistor element 8 used as a strain gage of a stress sensor, it can be said that the resin-based material is suitably used.

In the structure of the resistor element described above, when there is a portion at which conductors 9 on the two surfaces of the insulating board 3 are connected to each other through a conductive material provided inside a through-hole, the height of the conductors 9 may become higher than usual in some cases, and in particular, the present invention is preferably used. The reason the height of the conductor 9 may be increased is as follows. In a manufacturing step of a so-called double-sided circuit board, in order to connect wires on two surfaces to each other by forming a conductive layer on an inner wall of a through-hole formed in the insulating board 3, an electroless plating step is performed, and in the step mentioned above, the electroless plating layer is formed on portions which are to be formed into the conductors 9.

In the stress sensor having the third structure, as shown in FIG. 8 by way of example, the resistor elements 8 are provided on two lines, which are along the surface of the insulating board 3 forming the resistor elements 8 and perpendicularly intersect each other at the center of a sensor effective region of the surface of the insulating board 3, and are provided at substantially the same distance from the center, and the post 6 is bonded to or integrated with the surface of the insulating board 3 so that the center thereof substantially coincides with the center of the bottom surface of the post 6. In addition, by this stress sensor described above, the direction and magnitude of a stress applied to the post 6 can be grasped from the variation in resistance of the resistor elements 8 caused by elongation, contraction, or compression thereof resulting from the application of the stress to the post 6.

An example of the stress sensor having the third structure will be described with reference to FIG. 8. The conductors 9 in contact with the resistors 2 shown in FIG. 8, that is, the circuit pattern electrodes 1, are replaced with the thick film electrodes 13. The insulating board 3 is made, for example, of a glass fiber filled epoxy resin. On the bottom surface of the insulating board 3, four pairs of the circuit pattern electrodes 1 are provided so as to be electrically connected to the conductors 9, and the resistors 2 are provided between the respective pairs of the thick film electrodes 13, thereby forming the resistor elements 8. The resistor elements 8 are provided on two lines, which are along the surface of the insulating board 3 and intersect each other at the center of the surface thereof, and are provided at substantially the same distance from the center described above. The post 6 having an approximately square bottom surface is bonded to the top surface of the insulating board 3 with an adhesive or the like. In this case, the center of the bottom surface of the post 6 is placed so as to substantially coincide with the center of the surface of the insulating board 3. In addition, the L-shaped holes 10 are provided in the insulating board 3 so that the corners of the L shapes face the center of the insulating board 3. The role of the holes 10 are the same as described in the case of the stress sensor having the second structure described above.

Since the advantage obtained in the case in which the trimmable chip resistors 11 are provided on the top surface of the insulating board 3 which are to be connected to the respective resistor elements 8 in series is the same as that of the second structure, description thereof is omitted.

In this case, the "center" of the above "center of the sensor effective region" and "center of the bottom surface of the post 6" does not strictly mean the center point and includes deviation from the center point in which the stress sensor effectively functions. The meanings of the terms used for explaining the stress sensor having the third structure are equivalent to those used for the stress sensors having structures 1a to 1d and the second structure. In addition, of course, the combination of the third structure with the second structure and structures 1a to 1d is not denied. The combination described above is more preferable since the advantages thereof may be favorably enhanced.

In the structure of the third stress sensor shown in FIG. 8, the holes 10, the support holes 12, and the trimmable chip resistors 11 are particularly optional constituent elements (not essential elements) of the stress sensor of the present invention. Even when those described above are included in the constituent elements, the shape of the hole 10 is not limited to an L shape, and the positions at which the support holes 12 are provided are not limited to the four corners of the insulating board 3 having a square outline. The shape of the hole 10 may be optionally changed, for example, into a circular, a square, or a rounded square shape, in accordance with design limitation, required functions, applications, and the like. In addition, the support holes 12 may be provided at approximately center of each side of the square insulating board 3 shown in FIG. 8.

In the stress sensor having the third structure shown in FIG. 8, the bottom surface of the post 6 and part or the entirety of the resistor elements 8 may also overlap each other without the insulating board 3 provided therebetween. The advantage obtained in this case is the same as that of the stress sensor having the second structure. In addition, by the same reason as that of the stress sensor having the second structure, in the third structure shown in FIG. 8, a protection film covering at least the resistor elements 8 is preferably provided. The advantage of the stress sensor having the third structure which is formed of the resistor elements 8 is the same as that of the stress sensor having the second structure from the viewpoint that the resistor elements 8 have a small variation in resistance from the formation thereof.

The second structure of the resistor element 8 according to the present invention for achieving the objects described above comprises: electrodes composed of parts of the conductors 9 on a surface of the insulating board 3 obtained by partly removing a conductive layer on the surface as remains or by an additive method; and the resistor 2 formed by film formation between a pair of the circuit pattern electrodes 1 on the surface of the insulating board 3, wherein the resistor 2 cover two ends of the pair of the circuit pattern electrodes 1 in the width direction. In this case, the electrode width direction is the direction along the surface of the insulating board 3 and perpendicular to a current flowing direction when the current passes through the resistor element 8.

Since the resistor element 8 of the present invention has the second structure, an exuded part 14 shown in FIG. 12 (a) generated in the past can be reduced, and hence the variation in resistance of the resistor element 8 can be decreased. Since the exuded part 14 is formed of the resistor 2, is brought into contact with the circuit pattern electrode 1, and is electrically connected to the opposing electrode, the resistance of the resistor element 8 is influenced. The degree of the influence is an uncertain factor depending on the amount of the exuded part 14, the shape thereof, and the like. The reason for this is that it is very difficult to control the amount of the exuded part 14 and the shape thereof as described above. Hence, by eliminating the uncertain factor as is the structure described above of the present invention, even in the resistor element 8 comprising the electrodes composed of the parts of the conductors 9 on the surface of the insulating board 3 obtained as the remains by partly removing the conductor layer on the surface, and the resistor 2 provided by film formation between the pair of the electrodes on the surface of the insulating board 3, the variation in resistance of the resistor element 8 can be decreased.

As described above, in the case in which the circuit pattern electrode 1 is used, the exuded part 14 is easily generated as compared to the case in which the thick film electrode 13 is formed, and possible reasons for this will be described. The primary reason is believed that the circuit pattern electrode 1 has a large height and a surface approximately perpendicular to the surface of the insulating board 3 as described above. That is, for example, in the case in which a thick film resistor is formed by a screen printing method, first, an approximately predetermined amount of a resistor paste passed through a mask is provided between a pair of the circuit pattern electrodes 1. An area around the periphery of the circuit pattern electrode 1 becomes an easy-flow region for the resistor paste. The reason for this is that, around the periphery of the circuit pattern electrode 1, the paste provided at the vicinity of the peak of the circuit pattern electrode 1 is likely to flow from a higher position to a lower position by its own weight along the approximately perpendicular surface. Due to this easy flowing property, the flow amount becomes excessive, and as a result, the exuded part 14 is generated.

In the conventional resistor element 8 shown in FIG. 12(*b*), since the thick film electrode 13 has a small height and a smoothly inclined surface with respect to the surface of the insulating board 3, the easy-flow region for the resistor paste is not formed on the inclined surface, and as a result, the conditions are formed in which the exuded part 14 is not liable to occur.

Next, by the resistor element 8 having the second structure of the present invention, the possibility whether the uncertain factor is eliminated or not will be described. In FIG. 13, an example of the resistor element 8 is shown. The cross-section of this resistor element 8 is believed to have approximately the same cross-section as that shown in FIG. 2(*a*). However, as shown in FIG. 13, when the resistor 2 in the form of paste is provided beforehand at a position at which the exuded part 14 (FIG. 12(*a*)) may be generated, even if the paste moves in the easy-flow region by its own weight from a higher position to a lower position along the approximately peripheral surface, an excessive amount of this paste thus moved will be mixed with the resistor 2 paste provided at a distance from the surface of the circuit pattern electrode 1. Since the amount of the resistor 2 paste generating the exuded part 14 is basically small, even when it is mixed with the resistor 2 paste provided at a distance, the variation in resistance caused thereby is small enough to be ignored and cannot be the uncertain factor described above. Although the exuded part 14 shown in FIG. 12(*a*) is small, it has a function of increasing the area of the interface, in which a current density is high when electricity is applied, between the circuit pattern electrode 1 and the resistor 2, the interface being provided between resistor-element electrodes opposing each other. Hence, the resistance is largely influenced thereby, and as a result, the exuded part 14 is the uncertain factor as described above. Accordingly, by the structure of the present invention described above, it is clearly understood that the uncertain factor can be eliminated.

When the second structure of the resistor element 8 of the present invention comprises a portion at which circuit patterns on two surfaces of the insulating board 3 are connected to each other through a conductive material provided inside a through-hole, and the resistor 2 formed by film formation between a pair of electrodes on the surface of the insulating board 3, the electrodes formed of parts of the conductors 9 on the surface thereof, the height of the electrode may become larger than usual in some cases, and in particular, the present invention is preferably applied. The reason the height of the electrode may be larger is as follows. In a manufacturing step of a so-called double-sided circuit board, in order to connect wires on two surfaces to each other by forming a conductive layer on an inner wall of the through-hole formed in the insulating board 3, an electroless plating step is performed, and in the step mentioned above, the electroless plating layer is formed on portions which are to be formed into the circuit pattern electrodes 1.

A stress sensor having a fourth structure of the present invention comprises the resistor elements 8 having the second structure of the present invention or the preferable structure based thereon as a strain gage, and the post 6 bonded to or integrated with one of surfaces of the insulating board 3, wherein the direction and magnitude of a stress applied to the post 6 is grasped from the variation in resistance of the resistor elements 8 resulting from the application of the stress.

In the stress sensor described above, for example, as shown in FIGS. 1 and 8, the resistor elements 8 are provided on two lines, which are along a surface of the insulating board 3 forming the resistor elements 8 and perpendicularly intersect each other at the center of a sensor effective region of a surface of the insulating board 3, and which are provided at substantially the same distance from the center, and the post 6 is bonded to or integrated with the surface of the insulating board 3 so that the center thereof substantially coincides with the center of the bottom surface of the post 6. In addition, by this stress sensor described above, the direction and magnitude of a stress applied to the post 6 can be grasped from the variation in resistance of the resistor elements 8 caused by elongation, contraction, or compression thereof resulting from the application of the stress.

The operation and the advantages of the stress sensor having the fourth structure are the same as those of the third stress sensor. In addition, for example, a modified embodiment in which the trimmable chip resistors 11 are used or the like, similar to that of the third embodiment, may be performed. The meanings of the terms used for the stress sensor having the fourth structure are equivalent to those used for the stress sensors having structures 1a to 1d, the second structure, and structure 3. In addition, of course, the combination of the fourth structure with structures 1a to 1d, the second, and the third structures is not denied. The combination described above is more preferable since the advantages thereof may be favorably enhanced.

Figure 1:
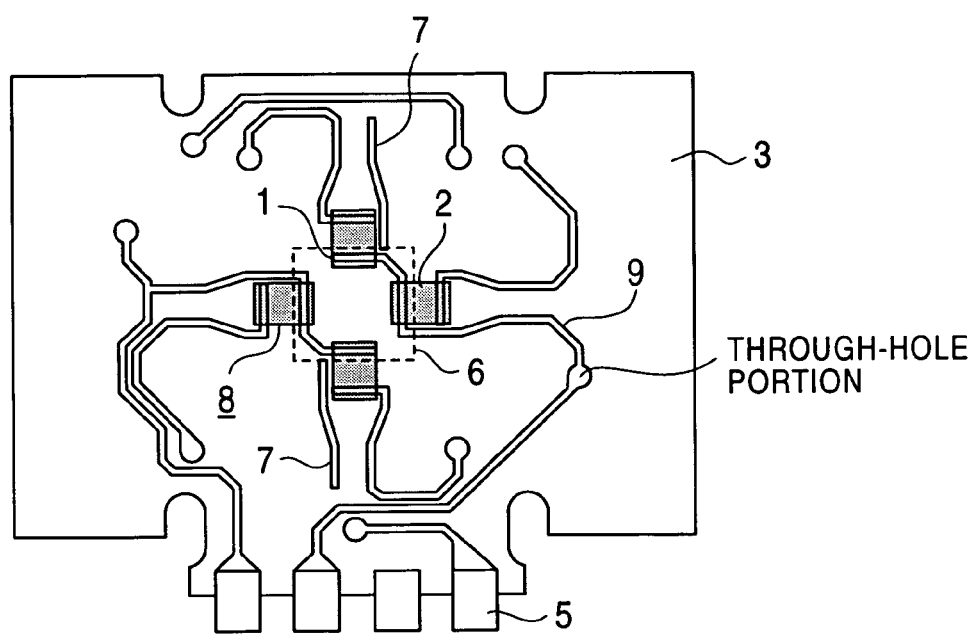
FIG. 1 is a view showing an example of a layout of conductors 9 of a stress sensor according to the present invention.
Figure 2:
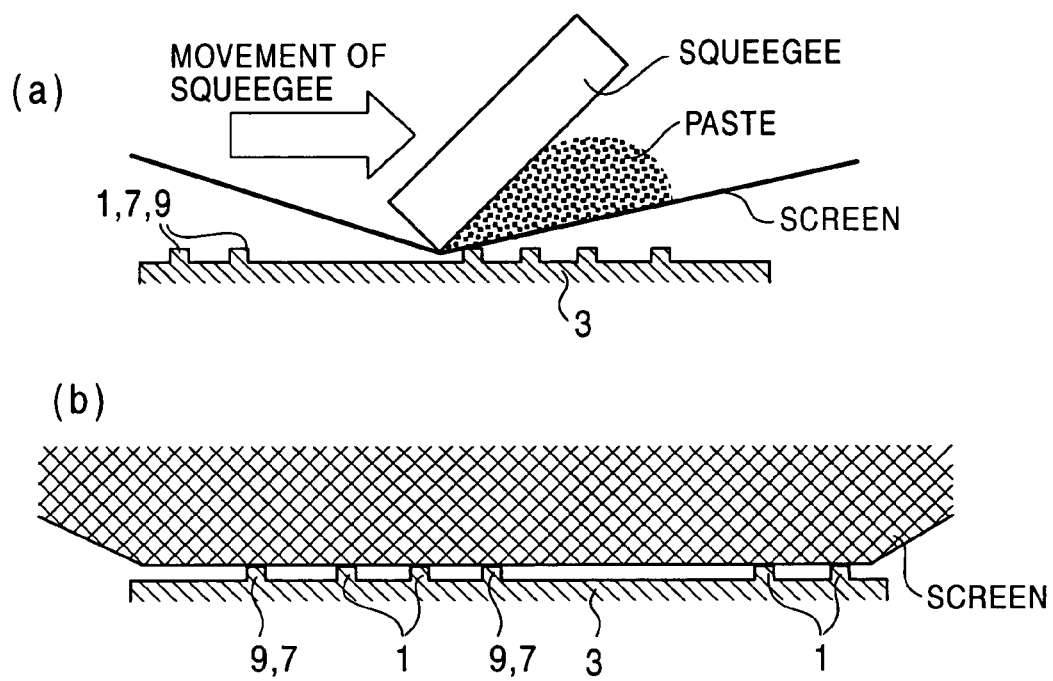
FIG. 2(a) is a schematic side view showing a screen printing step.
FIG. 2(b) is a schematic side view showing the screen printing step shown in FIG. 2(a) when viewed from between a screen and a board at a different angle.

Reference numerals in the figures indicate as follows, 1—circuit pattern electrode, 2—resistor, 3—insulating board, 5—board terminal part, 6—post, 7—print accuracy adjusting member, 8—resistor element, 9—conductor, 10—hole, 11—trimmable chip resistor, 12—support hole, 13—thick film electrode, 14—exuded part, 20—board, 22—resistor element, 24—board terminal part, and 30—post.

BEST MODE FOR CARRYING OUT THE INVENTION

Hereinafter, with reference to figures, an example of embodiments of stress sensors having structures 1a to 1d according to the present invention will be described, the stress sensor having a molded body of a glass fiber filled epoxy resin as a board (1.2 mm thick).

First, after copper foils 18 μm thick are adhered to both surfaces of an insulating board 3, known etching treatment is performed for the copper foils except for necessary portions thereof, thereby forming conductors 9, resistor-element electrodes (circuit pattern electrodes 1), and board terminal parts 5. A layout of the conductors 9 and resistor-element electrodes on a surface of the insulating board 3 of one stress sensor thus formed is shown in FIG. 1. In this case, the side at which the resistor elements are formed is only shown; however wires made of conductors are also provided on the rear surface of this insulating board 3.

On the surface of the insulating board 3, the conductors 9 (printing accuracy adjusting member 7) not functioning as wires are also formed by the etching treatment described above. By the presence of these printing accuracy adjusting members 7, for all four resistor elements 8, the arrangements of the conductors 9, the resistor-element electrodes, and the printing accuracy adjusting members 7, in the vicinities of the respective resistor elements 8, are similar to each other. In addition, for all the four resistor elements 8, the arrangements of the conductors 9, the resistor-element electrodes, and the printing accuracy adjusting members 7, in the vicinities of the respective resistor elements 8, are each formed so as to surround three sides of each of the respective resistors 2.

Next, a conductive material is supplied by an electroless plating method on inner walls of through-holes provided in the insulating board 3 beforehand, and hence the conductors on the front and the rear surfaces of the insulating board are electrically connected to each other. In FIG. 1, this position is shown as a "through-hole portion". In this step, the conductive material deposited by this electroless plating is also deposited on the surfaces of the conductors 9, the resistor-element electrodes, and the printing accuracy adjusting members 7, and hence the individual conductors 9, resistor-element electrodes, and printing accuracy adjusting members 7 have heights of 30 to 50 μm, which are approximately equivalent to each other.

Subsequently, a carbon resin-based resistor paste is supplied between the resistor-element electrodes (circuit pattern electrodes 1) by screen printing. In this step, the moving direction of the squeegee is inclined at approximately 45° with respect to the insulating board 3 shown in FIG. 1. The resin is then cured by heating, and hence the resistors 2 are obtained. In addition, in order to protect the resistors 2, a protection film formed of a silicone-based resin not shown in the figure is provided by a screen printing method so as to at least cover the resistor element, followed by heat curing.

Next, a columnar post 6 having a square bottom surface is fixed to the rear surface of the insulating board 3 with an epoxy resin-based adhesive. In this step, each side (outline of the bottom surface of the post 6) of the square bottom surface of the columnar post 6 is disposed at a position corresponding to the respective resistor elements provided on the front surface of the insulating board 3.

Figure 4:
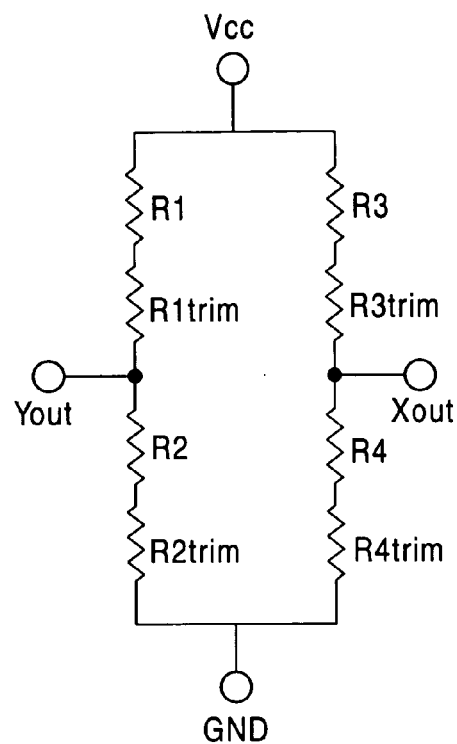
FIG. 4 is a view showing an overview of an input and output state of electrical signals of a stress sensor according to the present invention.

Furthermore, trimmable chip resistors (R1trim to R4trim) to be electrically connected to the respective resistor elements (R1 to R4) in series are mounted on the rear surface of the insulating board 3 so as to form the connection state shown in FIG. 4. This mounting is performed by using a known electronic component-mounting technique. Subsequently, resistance adjustment is performed for the trimmable chip resistors by laser trimming so that sets of the resistor elements and the respective trimmable chip resistors connected in series have substantially the same sum of resistances. The set described above is formed of the numerals corresponding to each other in a way such that R1 corresponds to R1trim.

Figure 3:
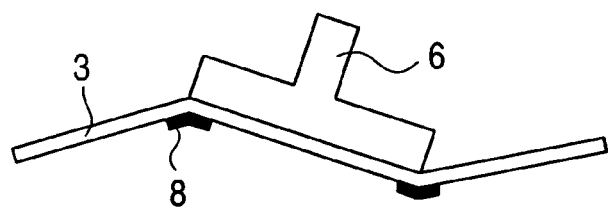
FIG. 3 is a view showing an example of operation of a stress sensor according to the present invention.

By the steps described above, the stress sensor of the present invention can be obtained. This stress sensor is used while the end portions of the insulating board 3 are generally fixed, and in particular, when the insulating board 3 has a square shape, the four corners thereof are fixed. In FIG. 3, the movement is briefly shown in the case in which a stress in the lateral direction is applied to the post 6 when the stress sensor is used. The insulating board 3 in contact with the bottom surface of the post 6 is not substantially warped, an area in the vicinity of the periphery of the bottom surface of the post 6 is maximally warped, and an area outside thereof is warped to some extent.

In FIG. 4, an overview of an input and output state of electrical signals of the stress sensor according to the present invention is also shown. Four sets each composed of the resistor element and a trimmable chip resistor 11 form a bridge circuit. Between voltage application terminals (Vcc) –(GND) of this bridge circuit, a predetermined voltage is applied. In addition, the resistor elements, the trimmable chip resistors, and a Y terminal (Yout), provided at the left side in the figure, form a stress sensor in the Y axis direction, and the resistor elements, the trimmable chip resistors, and a X terminal (Xout), provided at the right side in the figure, form a stress sensor in the X axis direction.

Figure 5:
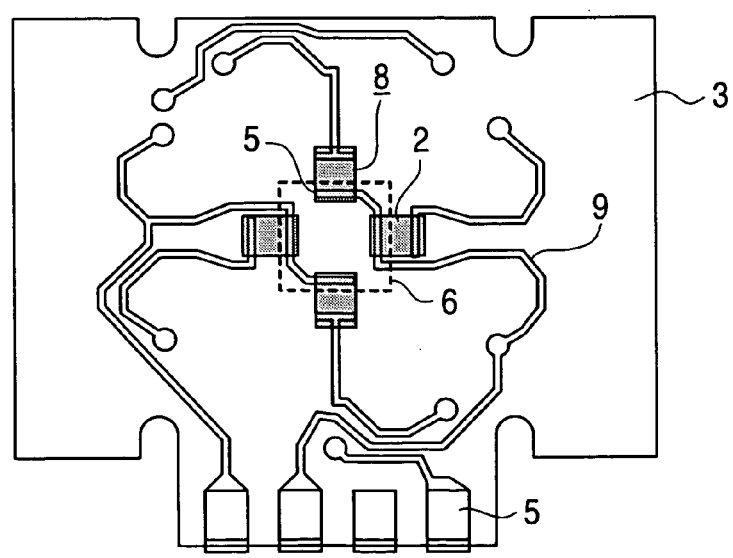
FIG. 5 is a view showing an example of a layout of conductors 9 of a stress sensor out of the scope of the present invention.
Figure 6:
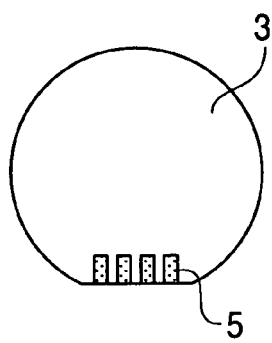
FIG. 6 includes views for illustrating "one end" according to the present invention.
Figure 6:
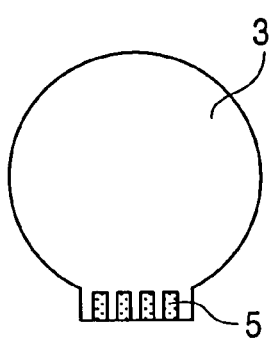
Figure 6:
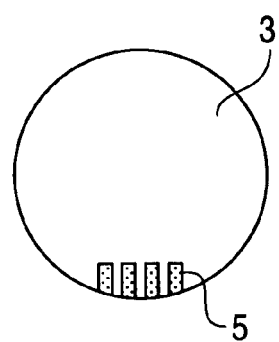
Figure 6:
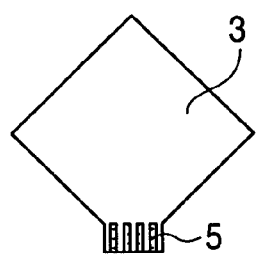
Figure 6:
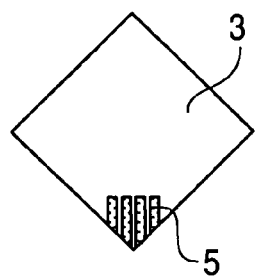
Figure 6:
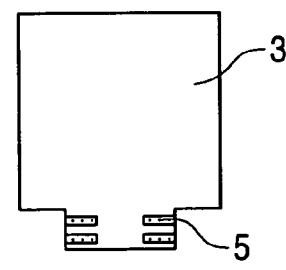
Figure 6:
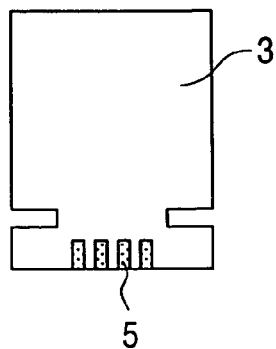
Figure 7:
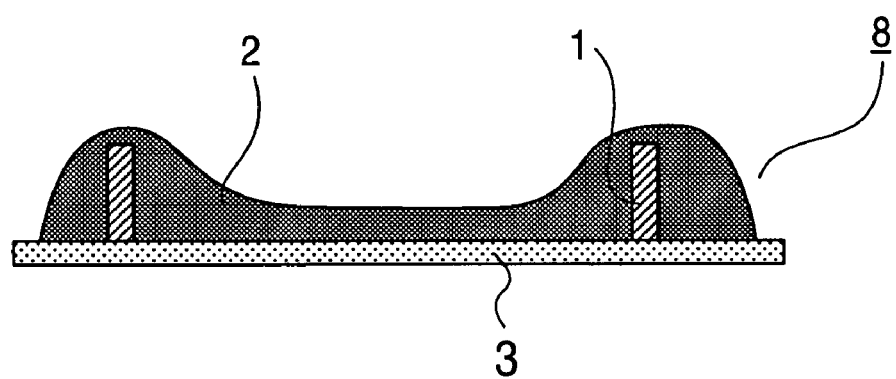
FIG. 7(a) is a cross-sectional view of a resistor element composed of circuit pattern electrodes.
FIG. 7(b) is a cross-sectional view of a resistor element composed of thick film electrodes.
Figure 7:
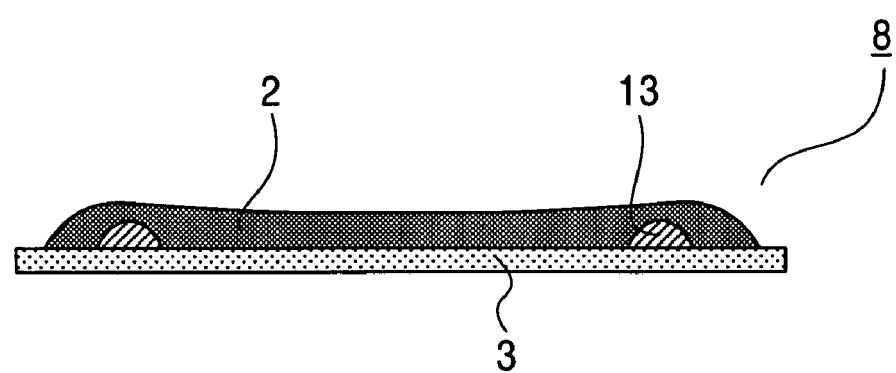

In FIG. 5, a surface layout of the insulating board 3 of a stress sensor (hereinafter referred to as "stress sensor B") out of the scope of the present invention is shown. In this sensor, the print accuracy adjusting members 7 shown in FIG. 1 are not present. In addition, the arrangements of the conductors 9 and the resistor-element electrodes (circuit pattern electrodes 1), in the vicinities of the respective four resistor elements 8, are not equal and not similar to each other. In addition, concerning two out of the four resistor elements, each of the arrangements of the conductors 9 and the resistor-element electrodes, in the vicinities of the corresponding resistor elements, is not formed so as to surround three sides of the periphery of each resistor 2.

(Experiments)

Comparative experiments were performed for the stress sensor of the present invention and stress sensor B. The manufacturing conditions for both sensors were entirely equivalent to each other except for the surface layout of the insulating board 3. The experimental (evaluation) item was the variation in resistance of individual resistor elements after the formation thereof. The variation in resistance of 30 samples for each stress sensor, that is, 120 resistor elements for each stress sensor, were shown by the standard deviation. The stress sensor of the present invention showed 41.5 Ω, and stress sensor B showed 57.3 Ω. In addition, in the stress sensor of the present invention, the variation in shape of the resistors in one stress sensor was not substantially observed, and on the other hand, in stress sensor B, the variation in resistance in one stress sensor was approximately equivalent to the standard deviation mentioned above. From these results, it is apparent that the variation in resistor shape in one stress sensor could be suppressed.

Next, with reference to figures (particularly FIG. 8), an example of an embodiment will be described relating to a resistor element having the first structure and a stress sensor having the second structure, according to the present invention.

A double-sided copper-clad laminate is prepared in which a copper foil approximately 18 μm thick used as a conductor layer is provided on each of two surfaces of a laminate primarily composed of a glass fiber filled epoxy resin having a thickness of 0.8 mm. The front, and the rear surfaces of this double-sided copper-clad laminate is patterned to form a great number of the insulating boards 3 having an approximately square shape, each regarded as one unit shown in FIG. 8. By this patterning, the insulating boards 3 are formed in the longitudinal and the lateral directions so that in each of the insulating boards 3, wires 7 and the circuit pattern electrodes 1 are formed and that the resistor elements 8 and the trimmable chip resistors 11 are electrically connected to each other at the last as shown in FIG. 4. In a first step of this patterning, holes are formed at positions at which conductive paths are required for electrical connection between the front and the rear surfaces of the double-sided copper-clad laminate. In a second step, in order to electrically connect the copper foils on the front and the rear surfaces to each other by forming conductors on inner walls of the through-holes thus formed, electroless copper plating with a catalyst and electrolytic copper plating are performed in that order. In this step, on the copper foils on the two surfaces of the board, copper is deposited by plating, and as a result, the total thickness of copper on the surface of the board becomes is approximately 50 μm. From a third step, the conductor layer on the front surface is partly removed by a known photoetching method using a dry film resist. As the remains of the conductor layer, the wires 7 and the circuit pattern electrodes 1 are obtained. After the steps described above, the distance (L) of a pair of the circuit pattern electrodes 1 is 1.2 mm. Hence, the ratio L/h is 24.

Next, the large insulating board thus formed is roll-pressed so as to adjust the circuit pattern electrodes 1 to have a height of 30 μm. By this step, the ratio L/h becomes 40.

Figure 8:
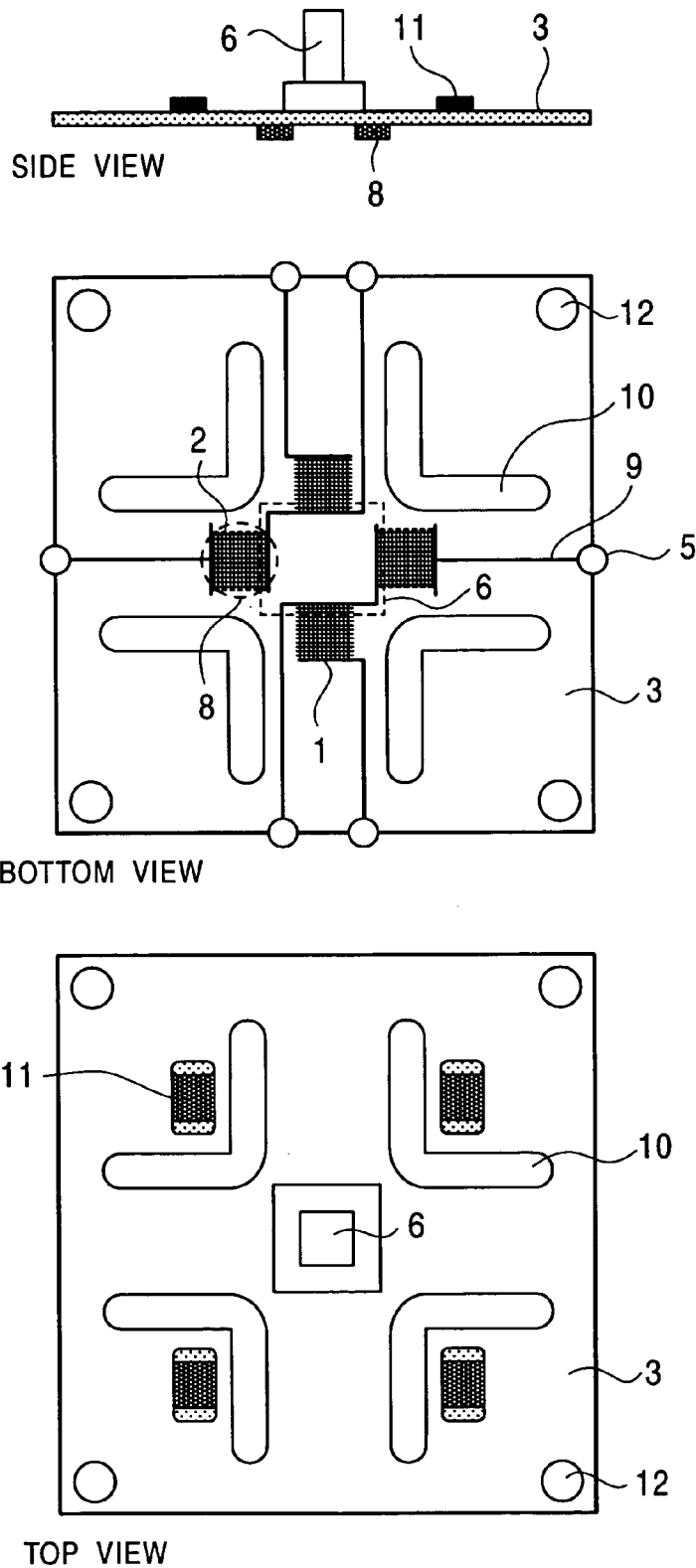
FIG. 8 includes views showing an example of a stress sensor of one embodiment according to the present invention.
Figure 9:
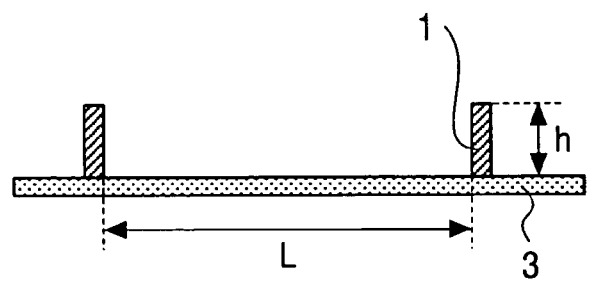
FIG. 9 is a view showing dimensional measurement positions of the distance (L) between electrodes and the height (h) of the electrode.

Next, each insulating board 3, which is one unit, is processed by punching to form the holes 10 shown in FIG. 8.

Next, a resistor paste formed of a thermosetting resin (carbon resin base) is provided between the circuit pattern electrodes 1 by screen printing followed by heating for curing, thereby forming the resistors 2. Furthermore, in order to protect the resistors 2, a silicone-based resin paste is screen-printed and is then cured, thereby forming a protection film. By the steps described above, the resistor elements 8 having the first structure of the present invention are obtained.

Next, the trimmable chip resistors 11 electrically connected with these resistor elements 8 in series by wiring are disposed by a know mounting technique and a reflow technique so as to realize the connection state with the resistors 2 as shown in FIG. 4. In addition, as shown in FIG. 8, the trimmable chip resistors 11 are disposed on the opposite surface of the board 3 from that for the resistor elements 8 and on the non-deformable portions described above.

Next, in order to adjust the sum of the resistances of the resistor element 8 and the trimmable chip resistor 11, electrically connected to the corresponding resistor element 8, to a predetermined range, laser trimming is performed for each of the trimmable resistors 11. The reason the trimming is not performed for the resistor 2 directly forming the resistor element 8 is that the prevention of destabilization in resistance is considered, which may occur when the resistor 8 made of a resin and the board 3, primarily formed of a resin and provided with the resistors 2, are processed by trimming. These resins show unstable behavior when processed by treatment, such as trimming, performed at a very high temperature.

Whether the trimmable chip resistors 11 are used or not should be determined in consideration of materials of individual members forming the resistor element 8 and materials for the insulating board 3. For example, when the material for the insulating board 3 is a ceramic, and the material for the resistor 2 is a metal glaze, even if the resistor 2 directly forming the resistor element 8 is processed by laser trimming, inconvenience such as resistance destabilization thereafter may be small enough to be ignored. Hence, in the case described above, the trimmable chip resistors 11 may not be used. However, when it is necessary to use the trimmable chip resistors 11 by some other reason, of course, they should be used in accordance with the necessity.

In addition, as shown in FIG. 8, to each unit, that is, to each insulating board 3, a post 6 made of a PBT molded part having a square bottom surface is fixed with an epoxy adhesive so that the bottom surface thereof is in contact with the opposite surface of the insulating board 3 from that on which the resistor elements 8 are provided and that the center of the bottom surface substantially coincides with the center of corresponding one unit of the insulating board 3. Accordingly, a set of a plurality of the stress sensors, according to the present invention, is obtained.

Next, in order to obtain the individual units, that is, the individual insulating boards 3 from the large insulating board, the large insulating board is cut and divided by a disc cutter along a plurality of dividing lines (visible or invisible lines may be used) formed on the surface of the large insulating board in the longitudinal and the lateral directions, and hence the individual stress sensors are obtained. When the posts 6 are fixed as in this example before the division is performed, the workability is improved. The reason for this is that operation for bonding the posts 6 to the divided and individual insulating boards 3 each having the stress sensor is complicated and inferior to that performed for the large insulating board 3 in terms of handling qualities and properties.

When the large insulating board is made of a ceramic such as alumina, a large insulating board provided with a great number of dividing grooves in the longitudinal and the lateral directions beforehand is preferably used. The reason for this is that without using a disc cutter, the dividing operation can be easily performed by applying a force with hand or the like so as to open the dividing grooves.

The stress sensor of the present invention is used, for example, while being fixed to a housing or the like of an electronic device using the support holes 12 shown in FIG. 8. In this fixed state, the peripheral portions of the insulating board 3, which are outside the holes 10, become non-deformable portions that are not substantially deformed even when a stress is applied to the post 6. In addition, the inside of the holes 10 is deformed when a stress is applied to the post 6 and hence becomes a deformable portion which elongates and contracts the resistor elements 8. This deformable portion serves as a "sensor effective region" on the surface of the insulating board 3.

FIG. 4 shows an overview of an input and output state of electrical signals of the stress sensor having the second structure. The state is the same as that of each of the stress sensors having structures 1a to 1d.

In the state in which the stress sensor is fixed to the housing, when a gap is present under the bottom surface of the stress sensor, a stress applied downward (in Z direction) to the post 6 can be detected. The reason for this is that by applying a stress downward as described above, all the four resistor elements used as a strain gage are elongated, and as a result, the individual resistances can be increased to approximately the same value. Since being different from electrical properties obtained when a stress is applied in the lateral direction (X direction or Y direction), the electrical properties described above can be discriminated therefrom.

In the stress sensor, when some function is created by using this stress application to the downside (z direction), multifunctionality can be enhanced. For example, when the stress sensor of the present invention is used as a pointing device of a computer, a so-called mouse-clicking function may be served by the stress application toward the downside described above. In addition, for example, when the stress sensor of the present invention is used as a multifunctional and multidirectional compact mobile device such as a mobile phone, stress application to the downside for a predetermined time may correspond to the instruction on ON and OFF operation of a power source of the mobile device.

In this example, in order to partly remove the copper foil used as a conductor layer on the front surface, a photoetching method using a dry film resist is used; however, an ED (Electro Deposition) method for depositing a photoresist by electrophoresis may be used instead. In addition, as means for forming the conductors 9 and the circuit pattern electrodes 1 shown in FIG. 8, instead of the method in which the conductor layer on the front surface is partly removed, of course, a so-called additive method can be used in which copper is grown by electroless plating on the front surface (including inner wall surfaces of through-holes) of the insulating board 3 followed by patterning.

Next, with reference to figures, an example of an embodiment will be described relating to a resistor element having the second structure and a stress sensor having the third structure, according to the present invention.

Figure 13:
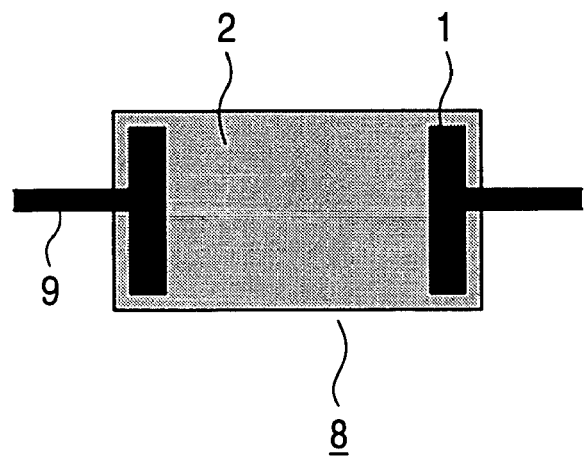
FIG. 13 is a top view of a resistor element having a second structure of the present invention, which forms a stress sensor having a fourth structure according to the present invention.

A process for forming the circuit pattern electrodes 1 and the insulating board 3, composed of a molded body of a glass fiber filled epoxy resin, from the start to the step of forming the resistors by screen printing is the same as that for the example of the embodiment of the resistor element having the second structure. In a subsequent step in which a thermosetting resin-based (carbon resin based) resistor paste is provided by screen printing between the circuit pattern electrodes 1 followed by heating for curing so as to obtain the resistors 2, the interval of the circuit pattern electrode 1 is set to 1.2 mm, the width of the resistor 2 is set to 1.6 mm, and as shown in FIG. 13, the resistor 2 is provided so as to cover two ends of the circuit pattern electrode 1 in the width direction. In addition, the entire top surface of the circuit pattern electrode 1 is covered with the resistor 2. The length of the resistor 2 protruding from each of the circuit pattern electrodes 1 to the conductor 9 (FIG. 8) side is set to approximately 0.2 mm.

Subsequently, in order to protect the resistors 2, a silicone-based resin paste is screen-printed followed by curing thereof, thereby forming the protection film. By the steps described above, the resistor element 8 having the second structure of the present invention can be obtained.

By performing subsequent steps of forming the stress sensor, which are the same as those for the stress sensor having the second structure, the stress sensor having the third structure can be obtained.

In this example, instead of a photoetching method using a dry film resist, of course, an ED method or an additive method may also be used.

Figure 12:
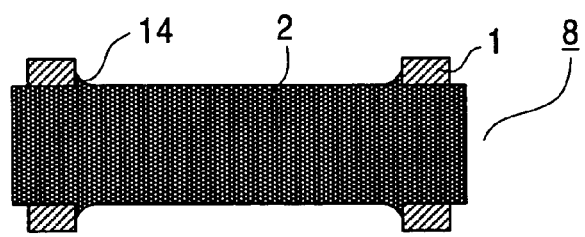
FIG. 12 is a view for illustrating the generation of an exuded part of a resistor in a resistor element.
Figure 12:
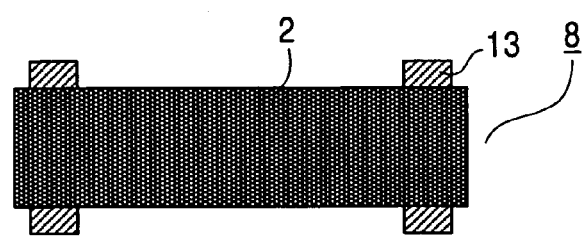
Figure 14:
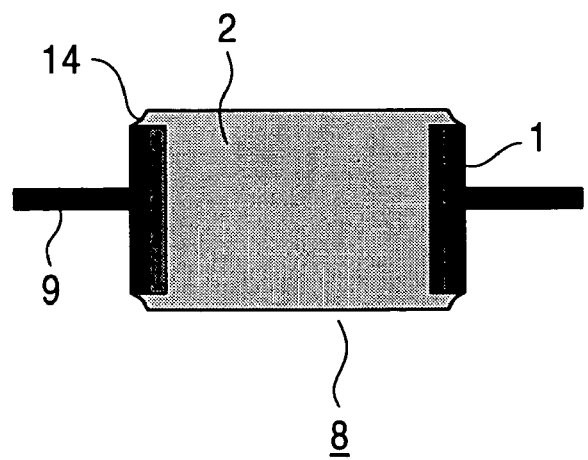
FIG. 14 is a top view of a resistor element having the second structure of the present invention, which forms the stress sensor having the fourth structure according to the present invention.
Figure 15:
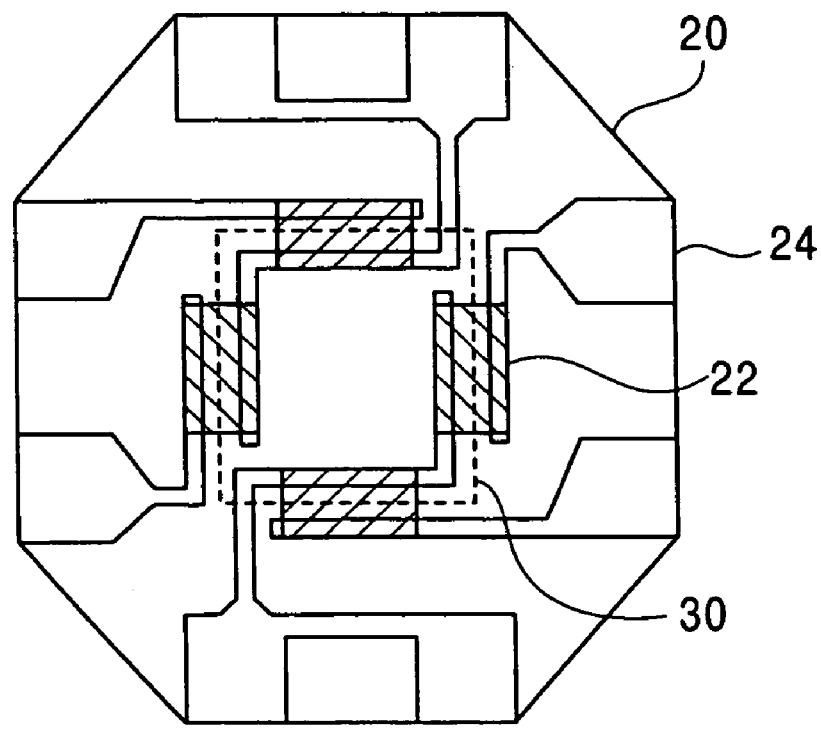
FIG. 15 is a view showing a layout of conductors 9 and the like of a conventional stress sensor.

In FIG. 14, another example of an embodiment of the resistor element 8 of the present invention is shown. In a manner different from that shown in FIG. 13, the entire both ends in the width direction of the circuit pattern electrode 1 viewed from the above are not covered, and parts of both ends in the width direction of the circuit pattern electrode 1 remain uncovered. In this case, an exuded part 14 is formed at a position different from that shown in FIG. 12(*a*) by the same mechanism as that in the case shown in FIG. 12(*a*). Even when the exuded part 14, the amount and the shape of which are not easily controlled, is generated at the position described above, the influence thereof on the resistance of the resistor element 8 is small enough to be ignored. The reason for this is that since this exuded part 14 is a very minute uncertain factor which is generated in the region other than that of the resistor 2 (the region in which a highest current density is obtained) in which two circuit pattern electrodes 1 oppose each other. Accordingly, since the resistor elements 8 shown in FIG. 14 achieve the objects of the present invention, they can be regarded as the example of the embodiment of the resistor element 8 of the present invention.

Next, with reference to figures, an example of an embodiment of the stress sensor having the fourth structure of the present invention will be described.

A process for forming a circuit pattern and the board, composed of molded body of a glass fiber filled epoxy resin, from the start to the step of forming the resistors by screen printing is the same as that for the example of each embodiment of the resistor elements having the second structures. However, the circuit pattern electrodes 1 are not formed, and thick film electrodes are formed instead as described below.

Figure 10:
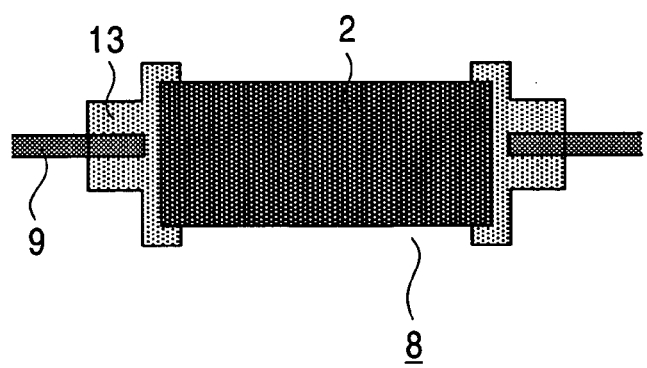
FIG. 10(a) is a top view of a resistor element forming a stress sensor having a third structure according to the present invention.
FIG. 10(b) is a side view thereof.
Figure 10:
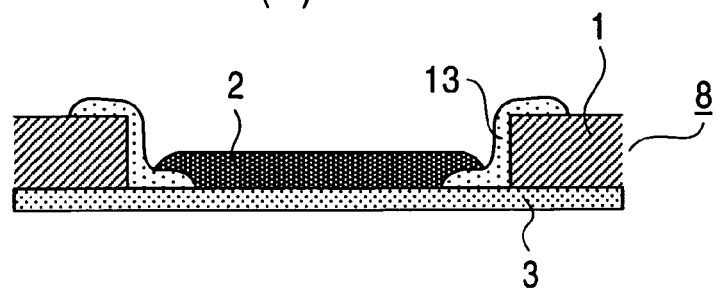
Figure 11:
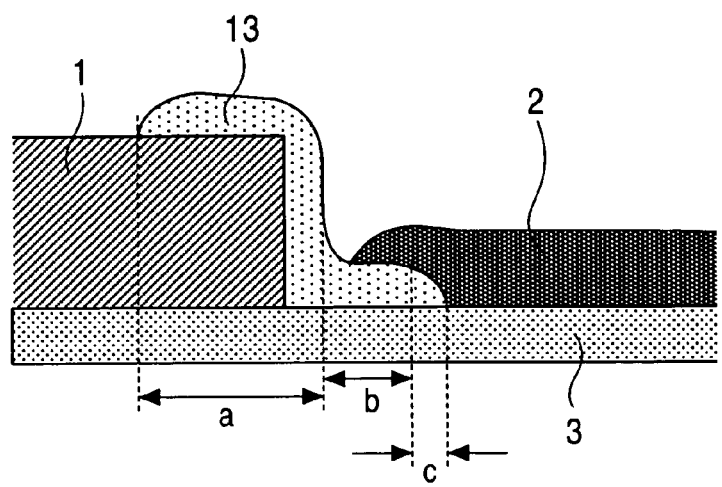
FIG. 11 is a view for illustrating an important portion of the stress sensor having the third structure according to the present invention.

A thermosetting resin-based (silver resin based) conductive paste is screen-printed followed by heating for curing to form thick film electrodes 13 while being in contact with the circuit pattern as shown in FIG. 10. Next, a thermosetting resin-based (carbon resin based) resistor paste is applied between pairs of the thick film electrodes 13 followed by heating for curing to form the resistors 2. In this step, the thick film electrode 13 and the resistor 2 are formed so as to be in contact with each other in regions b and c as shown in FIG. 11. In addition, in order to protect the resistors 2, a silicone-based resin paste is screen-printed followed by curing thereof, thereby forming the protection film.

By performing subsequent steps of forming the stress sensor, which are the same as those for each of the stress sensors having the second and the third structures, the stress sensor having the fourth structure can be obtained.

In this example, as the electrode for the resistor element 8, the thick film electrode 13 is used; however, instead thereof, the electrode for the resistor element 8 may be formed by a thin film technique such as sputtering, deposition, or plating. When the thickness thus formed is in a common range (several micrometers), the resistor element 8 having no first and second reasons described above can be obtained, and as a result the objects of the present invention can be achieved. In particular, in the case in which a step of plating copper on inner walls of the through-holes of the insulating board 3 is performed as in this example, the electrodes for the resistor element 8 can also be formed at the same time. Hence, since the stress sensor of the present invention can be obtained without performing the step of forming the thick film electrodes 13 as in this example, the process described above is believed to be preferable.

INDUSTRIAL APPLICABILITY

According to the present invention, even in a resistor element comprising electrodes composed of parts of conductors obtained as remains by partly removing a conductive layer on a surface of an insulating board, and resistors formed between pairs of the electrodes provided on the surface thereof, the variation in resistance of the resistor elements can be decreased. In addition, a stress sensor using the resistor elements in which the variation in resistance thereof is decreased can also be provided.

The stress sensor described above can be preferably used, for example, for a pointing device of a personal computer and a multifunctional and multidirectional switch for various electronic devices.

In addition, the stress sensor described above can be preferably applied to a stress sensor which uses a board formed of a molded plate of a glass fiber filled epoxy resin and which can reduce the cost as compared to that in the past.

The invention claimed is:

1. A stress sensor comprising:
   a insulating board having first and second surfaces, the second surface being opposite the first surface; a post bonded to or integrated with the first surface of the insulating board; a plurality of resistor elements disposed on the second surface of the insulating board, the resistor elements being composed of a plurality of resistors;
   a plurality of resistor-element electrodes disposed on the second surface of the insulating board; a plurality of board terminal pads disposed on the second surface of the insulating board proximate one end thereof; and a plurality of conductors disposed on the second surface of the insulating board, wherein the resistors are formed by a screen printing method between pairs of the resistor-element electrodes, the resistor-element electrodes are connected to the board terminal pads through the conductors, and the resistor-element electrodes and the conductors have a predetermined height from the second surface of the insulating board, the arrangements of the conductors and the resistor-element electrodes, in the vicinities of the respective resistor elements, are equal or similar to each other, and the direction and magnitude of a stress applied to the post are grasped from variation in resistance of the resistor elements caused by stimulation resulting from the application of the stress while suppressing variation in shape of each resistor element.

2. The stress sensor of claim 1, wherein said electrodes composed of parts of said conductors, obtained by an additive method; and said resistor elements formed by film formation, wherein the ratio L/h of the distance (L) between said pair of the electrodes to the height (h) of the electrodes is 30 or more.

3. The stress sensor of claim 1, wherein said electrodes composed of parts of said conductors, obtained by an additive method; and said resistor elements formed by film formation, wherein a height deviation of said pair of the electrodes is 0 or less.

4. The stress sensor of claim 1, wherein the arrangements of the conductors and the resistor-element electrodes, in the vicinities of the respective resistor elements, are each formed so as to surround at least three sides of each of the resistors.

5. The stress sensor of claim 1, wherein the resistor-element electrodes and the conductors are disposed so as to intermittently surround each of the resistor elements.

6. The stress sensor of claim 1, wherein the resistor-element electrodes and the conductors are disposed so as to continuously surround each of the resistor elements.

7. The stress sensor of claim 1, further comprising print accuracy adjustment members having the predetermined height from the second surface of the insulating board.

8. The stress sensor of claim 7, wherein the arrangements of the conductors, the resistor-element electrodes, and the print accuracy adjustment members, in the vicinities of the respective resistor elements, are equal or similar to each other.

9. The stress sensor of claim 7, wherein the arrangements of the conductors, the resistor-element electrodes, and the print accuracy adjustment members, in the vicinities of the respective resistor elements, are each formed so as to surround at least three sides of each of the resistors.

10. The stress sensor of claim 7, wherein the resistor-element electrodes, the conductors, and the print accuracy adjustment members are disposed so as to intermittently surround each of the resistor elements.

11. The stress sensor of claim 7, wherein the resistor-element electrodes, the conductors, and the print accuracy adjustment members are disposed so as to continuously surround each of the resistor elements.

* * * * *